US012796067B2

(12) United States Patent
Kang et al.

(10) Patent No.: US 12,796,067 B2
(45) Date of Patent: Nov. 10, 2026

(54) STACKED FETS CONTAINING DIFFERENT SHAPED INNER SPACERS

(71) Applicant: International Business Machines Corporation, Armonk, NY (US)

(72) Inventors: Tsung-Sheng Kang, Ballston Lake, NY (US); Tao Li, Slingerlands, NY (US); Ruilong Xie, Niskayuna, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 18/371,889

(22) Filed: Sep. 22, 2023

(65) Prior Publication Data

US 2025/0107218 A1 Mar. 27, 2025

(51) Int. Cl.

| | |
|---|---|
| ***H10D 84/83*** | (2025.01) |
| ***H10D 30/43*** | (2025.01) |
| ***H10D 30/67*** | (2025.01) |
| ***H10D 62/10*** | (2025.01) |
| ***H10D 84/85*** | (2025.01) |

(52) U.S. Cl.

CPC ............. *H10D 84/83* (2025.01); *H10D 30/43* (2025.01); *H10D 30/6735* (2025.01); *H10D 30/6757* (2025.01); *H10D 62/121* (2025.01); *H10D 84/85* (2025.01)

(58) Field of Classification Search

CPC .... H10D 84/83; H10D 84/85; H10D 84/0151; H10D 84/0167; H10D 84/0188; H10D 84/038; H10D 30/43; H10D 30/6735; H10D 30/6757; H10D 30/014; H10D 62/121; H10D 64/017; H10D 88/00; H10D 88/01

See application file for complete search history.

(56) References Cited

U.S. PATENT DOCUMENTS

| | | | | |
|---|---|---|---|---|
| 9,997,598 | B2 | 6/2018 | Smith et al. | |
| 11,315,938 | B1 * | 4/2022 | Reznicek | H10B 20/50 |
| 11,437,369 | B2 * | 9/2022 | Hwang | H10D 84/83 |
| 11,527,534 | B2 * | 12/2022 | Cheng | H10D 30/6715 |
| 2019/0172755 | A1 * | 6/2019 | Smith | B82Y 10/00 |
| 2020/0243554 | A1 | 7/2020 | Lee et al. | |
| 2022/0367658 | A1 * | 11/2022 | Yim | H10D 30/031 |
| 2023/0075966 | A1 | 3/2023 | Xie et al. | |
| 2023/0085628 | A1 | 3/2023 | Xie et al. | |

(Continued)

FOREIGN PATENT DOCUMENTS

| | | |
|---|---|---|
| TW | I731138 B | 6/2021 |
| TW | I744358 B | 11/2021 |

*Primary Examiner* — John M Parker
*Assistant Examiner* — Vicente Rolando Gonzales
(74) *Attorney, Agent, or Firm* — Scully, Scott, Murphy & Presser, P.C.; Samuel Waldbaum

(57) ABSTRACT

A semiconductor structure is provided that includes stacked field effect transistors (FETs) that have different shaped inner spacers. Notably, the stacked FETs include a first FET having a horizontal inner spacer and a second FET stacked over the first FET and having a fork shaped inner spacer. The present application also provides a method of forming such as a semiconductor structure. The method avoids gate dielectric spacer fang formation in the source/drain regions and thus avoids problems with forming the stacked nanosheet structure of the first FET.

15 Claims, 28 Drawing Sheets

(56) References Cited

U.S. PATENT DOCUMENTS

| | | | | |
|---|---|---|---|---|
| 2023/0111270 | A1* | 4/2023 | Cheng | H10D 30/014 257/288 |
| 2023/0139379 | A1 | 5/2023 | Xie et al. | |
| 2023/0178559 | A1 | 6/2023 | Xie et al. | |
| 2023/0402507 | A1* | 12/2023 | Galatage | H10D 30/6713 |

* cited by examiner

STACKED FETS CONTAINING DIFFERENT SHAPED INNER SPACERS

BACKGROUND

The present application relates to semiconductor technology, and more particularly to a semiconductor structure including stacked field effect transistors (FETs).

Stacking of FETs is an attractive architecture for future complementary metal oxide semiconductor (CMOS) scaling, and potentially for ultimately scaled technology. By directly stacking FETs one over the other (for example, pFETs over nFETs, nFETs over pFETs, pFETs over pFETs, or nFETs over nFETs) significant area scaling can be achieved.

SUMMARY

The present application provides a semiconductor structure including stacked FETs that have different shaped inner spacers. Notably, the semiconductor structure includes a first FET having a horizontal inner spacer and a second FET stacked over the first FET and having a fork shaped inner spacer. The present application also provides a method of forming such as a semiconductor structure. The method avoids gate dielectric spacer fang formation in the source/drain regions and thus avoids problems with forming the stacked nanosheet structure of the first FET.

In one aspect of the present application, a semiconductor structure is provided. In one embodiment, the semiconductor structure includes a second FET stacked above a first FET, a horizontal inner spacer located in a spacer region of the first FET, and a fork shaped inner spacer located in a spacer region of the second FET.

DETAILED DESCRIPTION

Figure 1:
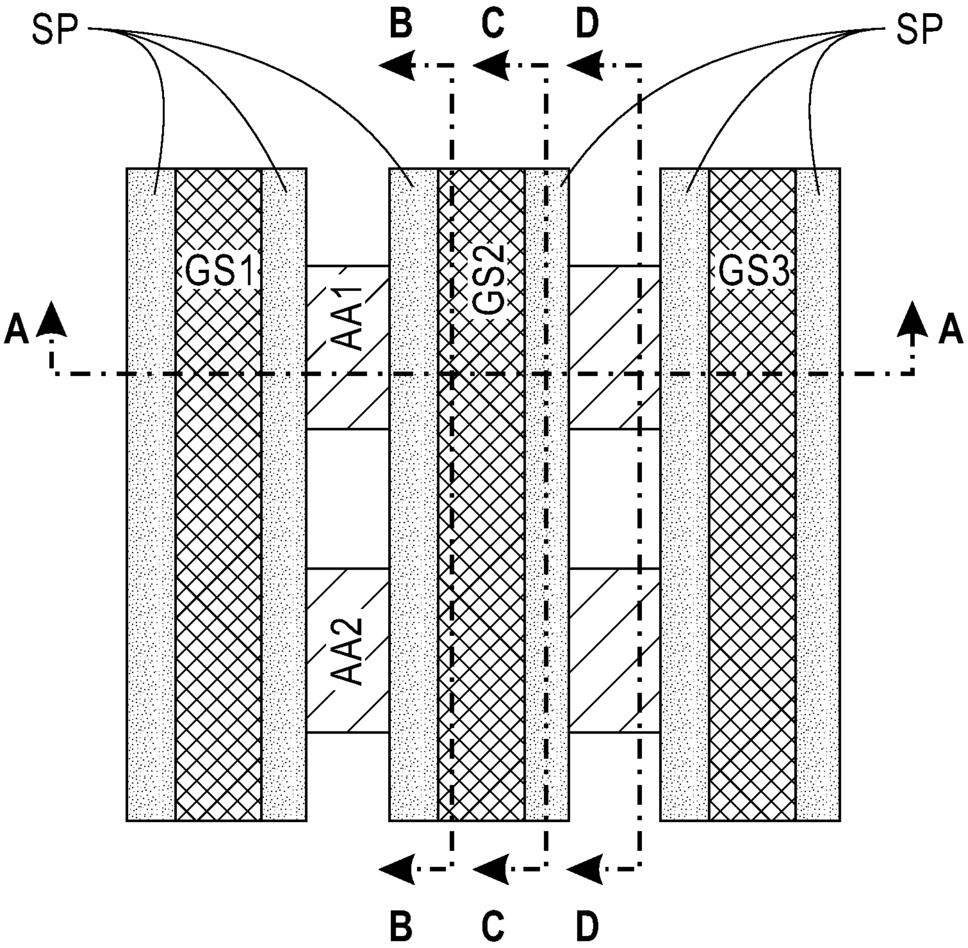
FIG. 1 is a top-down view of an exemplary semiconductor device layout that can be employed in accordance with an embodiment of the present application, the semiconductor device layout includes a plurality of active areas oriented along a first direction, and a plurality of gate structures that are oriented in a second direction which is perpendicular to the first direction; in the drawing cut A-A, cut B-B, cut C-C and cut D-D are shown.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In conventional stack nanosheet transistor formation, a gate spacer is formed prior to forming the top and bottom nanosheet stacks. The gate spacer is typically present adjacent to a sacrificial gate structure that straddles a fin structure that contains a bottom material stack and a top material stack. The gate spacer and the sacrificial gate structure are used as a combined etch mask during a recess etch that is used to convert the top material stack into a top nanosheet stack. A gate spacer fang remains in the source/drain region after this recess etch and this fang blocks the subsequent recess etch used to convert the bottom material stack into a bottom nanosheet stack. Any attempt to remove the gate spacer fang will result in unwanted pull down of the gate spacer that is formed adjacent to the sacrificial gate structure. A solution to the above problem is needed.

Referring now to FIG. 1, there is illustrated an exemplary semiconductor device layout that can be employed in accordance with an embodiment of the present application. The semiconductor device layout illustrated in FIG. 1 includes a plurality of active areas (e.g., first active area AA1 and second active area AA2) oriented along a first direction, and a plurality of gate structures (e.g., first gate structure GS1, second gate structure GS2, and third gate structure GS3) that are oriented in a second direction which is perpendicular to the first direction. FIG. 1 includes cut A-A, cut B-B, cut C-C and cut D-D. Cut A-A is through the first active area AA1, and along a length-wise direction of AA1. Cut B-B is through GS2 and along a length-wise direction of GS2. Cut C-C is in the spacer, SP, region that is located laterally adjacent to GS2. Cut D-D is in the source/drain region that located between GS2 and GS3; note that each of Cut B-B. Cut C-C and Cut D-D are in the same direction.

In the present application, a semiconductor structure is described and illustrated as stacked nanosheet transistors. A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around a portion of each of the spaced apart semiconductor channel material nanosheets. In some cases, nanosheet transistors are thus referred to as gate-all-around (GAA) transistors. Stacked nanosheet transistors (or FETs) include a second (or top) nanosheet stack of vertically stacked and spaced apart second semiconductor channel material nanosheets located above a first (or bottom) nanosheet stack of vertically stacked and spaced apart first semiconductor channel material nanosheets. A gate structure wraps around a portion of each of the vertically stacked and spaced apart first and second semiconductor channel material nanosheets.

In the present application, a semiconductor structure such as illustrated in FIGS. 20A-20D is provided that includes a second FET stacked above a first FET, horizontal inner spacer 44 located in a spacer region of the first FET, and fork shaped inner spacer 45 located in a spacer region of the second FET. Typically a plurality of horizontal inner spacers 44 are formed. Stacked FETs provide significant area scaling.

In nanosheet FETs, the inner spacers are used to cover the gate electrode of the gate structure, so their shapes are determined by the metal gate electrode shape. In the present application, the sacrificial semiconductor material pillar 34 allows for the formation of a self-aligned gate electrode into the gap between the dielectric pillar 36 and the top nanosheet stack. If the sacrificial semiconductor material pillar 34 was not present, an extra lithographic process would be required to just open the region right above the sacrificial semiconductor material pillar 34, so that the etch can open that region before the metal electrode of the gate structure can reach into the gap. With the sacrificial semiconductor material pillar 34, it is possible to differentiate the etch rate from the neighboring dielectric pillar 36. Thus, and in the present application, an etch is used which removes the sacrificial semiconductor material pillar 34 and the second sacrificial semiconductor material nanosheets 18NS. The fork shaped gate electrode cannot be allowed to directly contact the second source/drain regions 50. To prevent this from occurring, the fork shaped inner spacer 45 is used. Thus, shorting of second FET is eliminated by the presence of the fork shaped inner spacer 45.

In embodiments of the present application, and as is illustrated in FIGS. 20A-20D for example, the semiconductor structure can further include middle dielectric isolation layer 28 separating the first FET from the second FET and separating the horizontal inner spacer 44 from the fork shaped inner spacer 45. The presence of the middle dielectric isolation layer 28 provides electrical isolation between the first and second FETs and aids in separating the different shaped inner spacers from each other.

In embodiments of the present application, and as is illustrated in FIGS. 20A-20D for example, the semiconductor structure can further include dielectric pillar 36 located laterally adjacent to the fork shaped inner spacer 45 and located on a surface of the middle dielectric isolation layer 28. The presence of the dielectric pillar 36 provides for forming a self-aligned gate extension 54E in the region including the second FET and helps in determining the width of nanosheet stacks of the first FET.

In embodiments of the present application, the first FET and the second FET include a common gate structure (i.e., gate structure 54 illustrated, for example, in in FIGS. 20A-20D), in which the dielectric pillar 36 is located laterally adjacent to gate extension 54E of the second FET. The gate extension 54E is self-aligned and such a self-aligned gate extension 54E minimizes the capacitance of the second FET and provides a robust stacked FET device.

In embodiments of the present application, the first FET is a first nanosheet FET including a plurality of vertically stacked and spaced apart first semiconductor channel material nanosheets 14NS, and the second FET is a second nanosheet FET including a plurality of vertically stacked and spaced apart second semiconductor channel material nanosheets 20NS. Stacked nanosheet FETs provide greater channel width, $W_{eff}$, and thus more current can flow through the nanosheet channel as compared to stacked FinFETs or stacked planar devices.

In embodiments of the present application, each first semiconductor channel material nanosheet of the plurality of vertically stacked and spaced apart first semiconductor channel material nanosheets 14NS is composed of a semiconductor material that is compositionally the same as a semiconductor material that provides each second semiconductor channel material nanosheet of the plurality of vertically stacked and spaced apart second semiconductor channel material nanosheets 20NS. This aspect shows the diversity of the present application.

In embodiments of the present application, each first semiconductor channel material nanosheet of the plurality of vertically stacked and spaced apart first semiconductor channel material nanosheets 14NS is composed of a semiconductor material that is compositionally different from a semiconductor material that provides each second semiconductor channel material nanosheet of the plurality of vertically stacked and spaced apart second semiconductor channel material nanosheets 20NS. This aspect shows the diversity of the present application and allows for tailoring the type of electron mobility through the channel region of the first and second FETs.

Figure 20B:
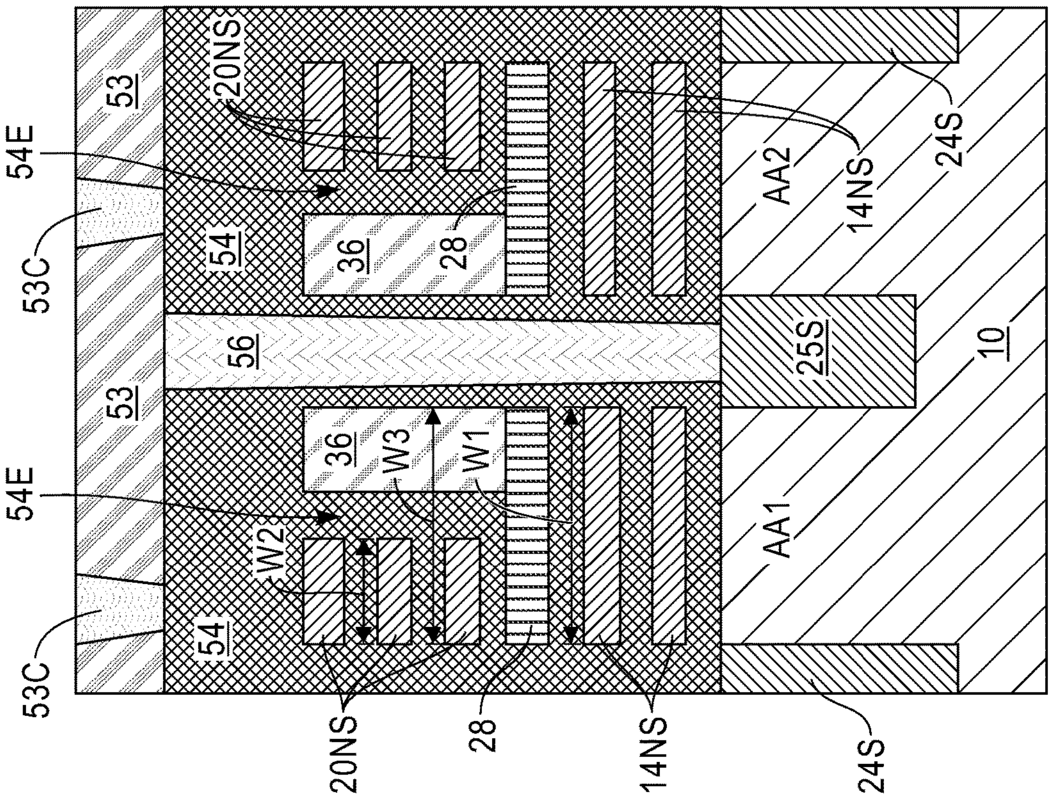
FIGS. 20A-20D are cross-sectional views of the exemplary semiconductor structure shown in FIGS. 19A-19D, respectively, after forming a fifth ILD layer, wherein the fifth ILD layer and the fourth ILD layer collectively provide a middle-of-the-line (MOL) dielectric layer, and forming contact structures.
Figure 20A:
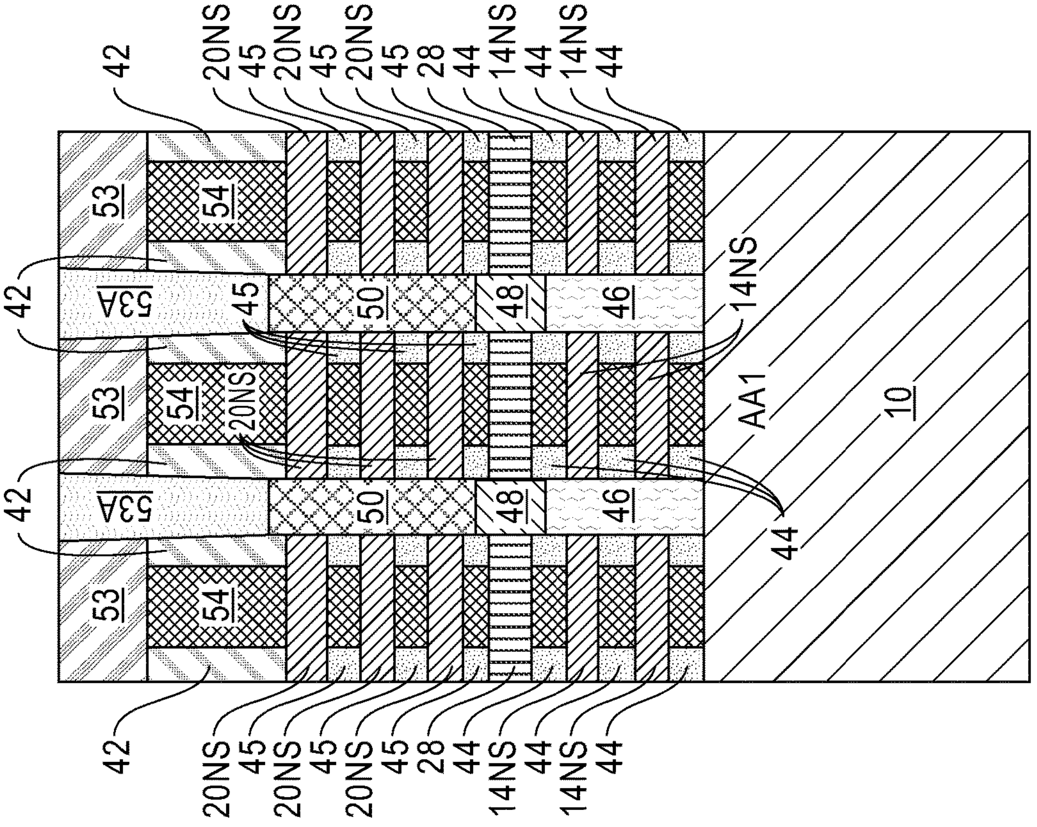

In embodiments of the present application and as shown for example, in FIG. 20B, each first semiconductor channel material nanosheet of the plurality of vertically stacked and spaced apart first semiconductor channel material nanosheets 14NS has a first width, w1, and each second semiconductor channel material nanosheet of the plurality of vertically stacked and spaced apart second semiconductor channel material nanosheets 20NS has a second width, w2, wherein the first width is greater than the second width. A wider nanosheet width allows for a large electron flow through the nanosheets.

In embodiments of the present application and as shown for example, in FIG. 20B, a third width, W3, as measured from an outermost sidewall of each second semiconductor channel material nanosheet of the plurality of vertically stacked and spaced apart second semiconductor channel material nanosheets 20NS to an outermost sidewall of the dielectric pillar 36 is substantially equal (within ±10%) to the first width, W1. In the present application, and as depicted in FIG. 20B, the outermost sidewall of each second semiconductor channel material nanosheet of the plurality of vertically stacked and spaced apart second semiconductor channel material nanosheets 20NS and the outermost sidewall of the dielectric pillar 36 used in determining W3 face away from each other. This aspect of the present application shows the importance of providing the dielectric pillar 36 during the formation of the nanosheet stack of the first FET.

Figure 20D:
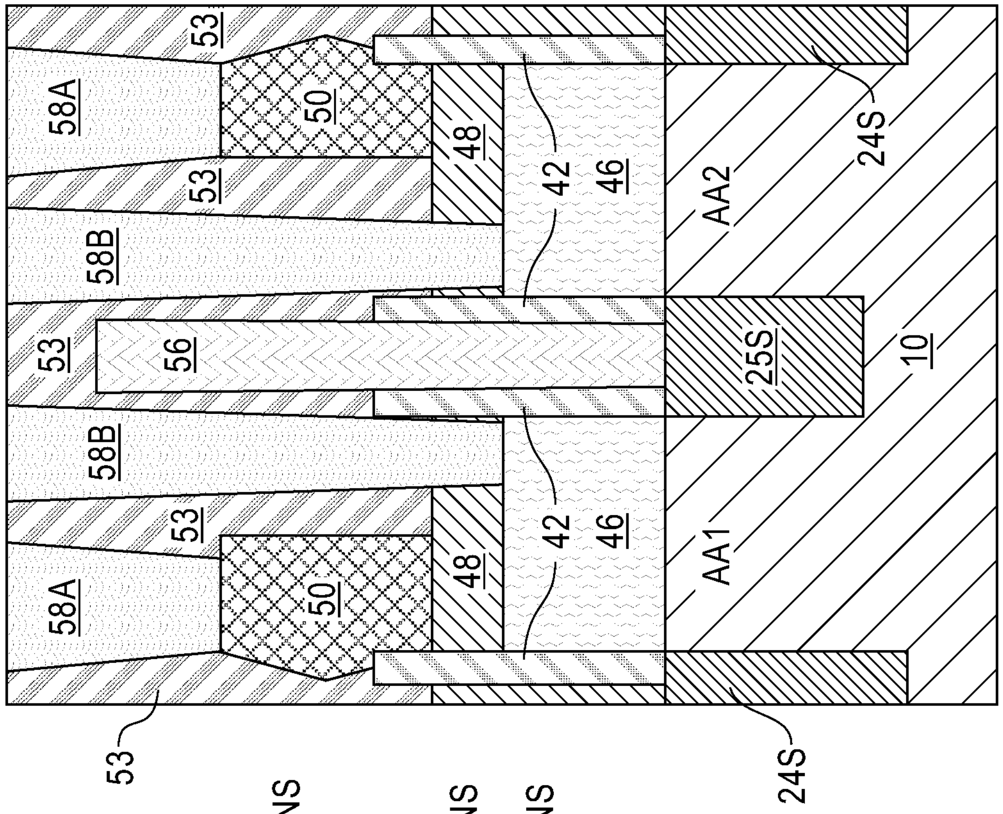
Figure 20C:
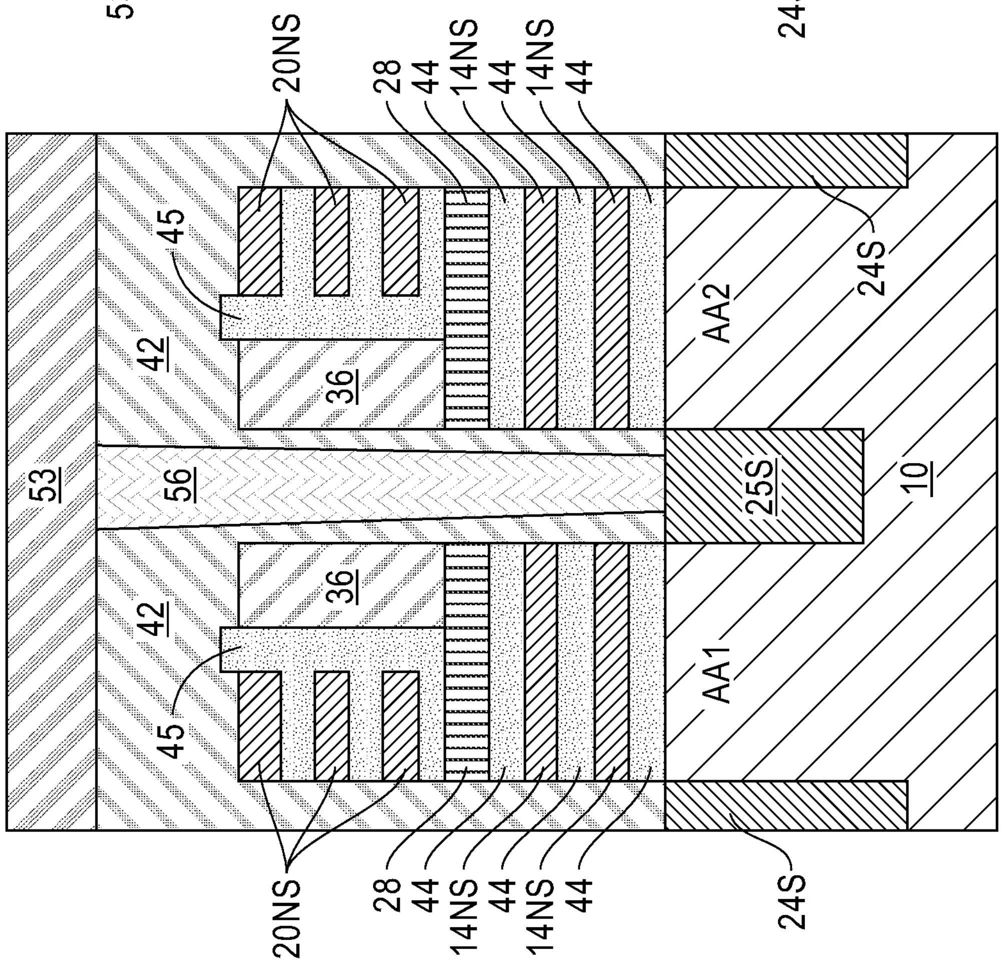

In embodiments of the present application and as shown for example, in FIGS. 20A-20D, the structure can further include gate cut dielectric pillar 56 located adjacent to the first FET and the second FET, wherein the gate cut dielectric pillar 56 lands on a surface of a shallow trench isolation structure (i.e., the second shallow trench isolation structure 25S shown in FIGS. 20B-20D). The gate cut dielectric pillar 56 is used to separate the gate structure 54 between different active areas, e.g., AA1 and AA2 shown in FIGS. 20B-20D.

In embodiments of the present application and as shown for example, in FIGS. 20A-20D, the first FET includes first source/drain regions 46, and the second FET include second source/drain regions 50.

In embodiments of the present application and as shown for example, in FIGS. 20A-20D, the first source/drain regions 46 are spaced apart from the second source/drain regions 50 by an ILD layer (i.e., the third ILD layer 48). The presence of this ILD layer between the first and second source/drain regions electrically isolates the first source/drain regions 46 from the second source/drain regions 50 thus preventing source/drain to source/drain shorts.

In embodiments of the present application and as shown for example, in FIG. 20D, at least the first source/drain regions 46 and the ILD layer (i.e., the third ILD layer 48) are confined in an area between a pair of gate dielectric spacers 42.

In embodiments of the present application, the second source/drain regions 50 are diamond shaped (i.e., they have faceted sidewalls).

In embodiments of the present application, the second source/drain regions 50 are non-diamond shaped (i.e., they have a least one sidewall that is substantially perpendicular to a horizontal surface of semiconductor substrate 10). This embodiment is show in FIG. 20D and the non-diamond shaped second source/drain regions 50 provide a greater space for forming a contact structure to the first source/drain regions 46. This prevents shorts from occurring.

In embodiments of the present application, first source/drain contact structure 58B contacts one of the first source/drain regions 46, and second source/drain contact structure 58A contacts one of the second source/drain regions 50.

In embodiments of the present application, gate contact structure 58C is present that contacts a gate electrode of the common gate structure (i.e., gate structure 54).

In embodiments of the present application, the horizontal inner spacer 44 and the fork shaped inner spacer 45 are composed of a compositionally same inner dielectric spacer material.

In embodiments of the present application, the first FET is of a first conductivity type and the second FET is a second conductivity type, wherein the first conductivity type is different from the second conductivity type. In one example, the first conductivity type is p-type, and the second conductivity type is n-type. Notably, the first FET can be a pFET, and the second FET can be an nFET. In another example, the first conductivity type is n-type and the second conductivity type is p-type. Notably, the first FET can be an nFET, and the second FET can be a pFET.

In embodiments of the present application, the first FET is of a first conductivity type and the second FET is a second conductivity type, wherein the first conductivity type is the same as the second conductivity type. Notably, the first FET and the second FET can be nFETs or pFETs.

These and other aspects of the present application will now be described in greater detail.

Figure 2A:
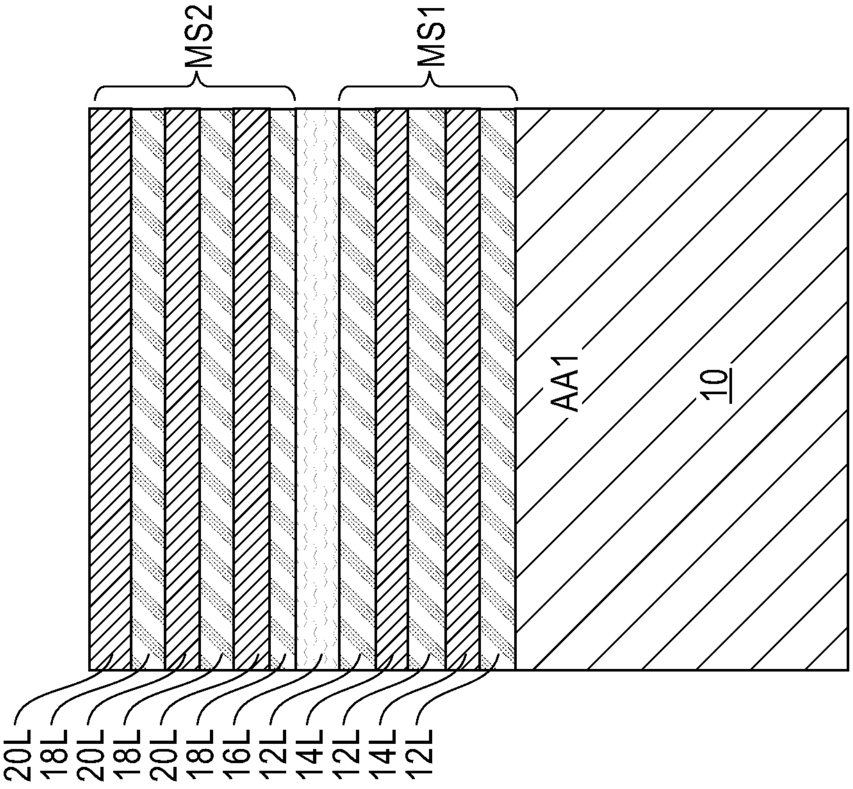
FIGS. 2A and 2B are cross-sectional views of an exemplary semiconductor structure corresponding to cuts A-A and B-B shown in FIG. 1, respectively, that can be employed in the present application, the semiconductor structure includes a semiconductor substrate, a first material stack, a placeholder semiconductor material layer and a second material stack.
Figure 2B:
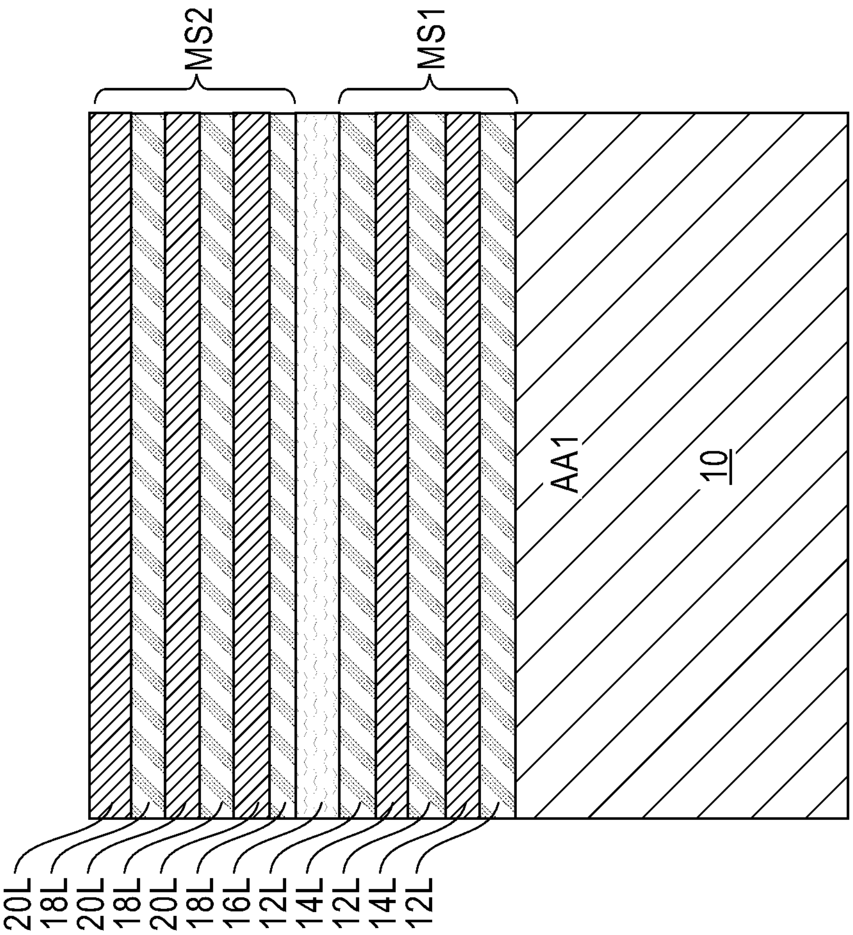

Referring now FIGS. 2A and 2B, there are illustrated an exemplary semiconductor structure corresponding to cuts A-A and B-B shown in FIG. 1, respectively, that can be employed in the present application. The exemplary structure illustrated in FIGS. 2A-2B includes a semiconductor substrate 10, a first material stack MS1, a placeholder semiconductor material layer 16L and a second material stack MS2. As is illustrated, the placeholder semiconductor material layer 16L is positioned between the first material stack MS1 and the second material stack MS2.

The semiconductor substrate 10 includes at least one semiconductor material. The term "semiconductor material" is used throughout the present application to denote a material having semiconducting properties. Examples of semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate that is entirely composed of one semiconductor material. In one example, the bulk semiconductor substrate is composed entirely of silicon. In another embodiment, the semiconductor substrate 10 is a bulk semiconductor substrate that is composed of two or more semiconductor materials. In one example, the bulk semiconductor substrate is composed of a layer of silicon and a layer of silicon germanium. In another embodiment, the semiconductor substrate 10 is a semiconductor-on-insulator substrate (SOI) that includes a dielectric layer separating a bottom semiconductor layer from a top semiconductor layer. In one example, the SOI substrate includes a bottom semiconductor layer composed of Si, a dielectric layer composed of silicon dioxide and/or boron nitride, and a top semiconductor layer composed of one of silicon, germanium or a silicon germanium alloy. SOI substrates can be formed by wafer bonding or by a separation by an ion implantation of oxygen (i.e., SIMOX) process.

The first material stack MS1 includes alternating first sacrificial semiconductor material layers 12L and first semiconductor channel material layers 14L. In the illustrated embodiment, the first material stack MS1 includes "n" number of first semiconductor channel material layers 14L and "n+1" number of first sacrificial semiconductor material layers 12L, wherein n is an integer starting at 1; typically n is 2 or more. In the illustrated embodiment, n is 2 thus there are two first semiconductor channel material layers 14L and three first sacrificial semiconductor material layers 12L present in the first material stack MS1 illustrated in FIGS. 2A-2B. In the illustrated embodiment, each first semiconductor channel material layer 14L is sandwiched between a top first sacrificial semiconductor material layer and a bottom first sacrificial semiconductor material layer.

In the present application, each first sacrificial semiconductor material layer 12L is composed of a first semiconductor material, while each first semiconductor channel material layer 14L is composed of a second semiconductor material that is compositionally different from the first semiconductor material. In the present application, the first and second semiconductor materials include one of the semiconductor materials mentioned above for the semiconductor substrate 10. In some embodiments, the second semiconductor material that provides each first semiconductor channel material layer 14L can provide high channel mobility for n-type FET devices (i.e., nFETs). In other embodiments, the second semiconductor material that provides each first semiconductor channel material layer 14L can provide high channel mobility for p-type FET devices (i.e., pFETs). In one example, each first sacrificial semiconductor material layer 12L is composed of a silicon germanium alloy having a germanium content from 20 atomic percent to 40 atomic percent, and each first semiconductor channel material layer 14L is composed of silicon. Other combinations of semiconductor materials are possible as long as the first semiconductor material that provides each first sacrificial semiconductor material layer 12L is compositionally different from the second semiconductor material that provides each first semiconductor channel material layer 14L.

The placeholder semiconductor material layer 16L is composed of a third semiconductor material that is compositionally different from either the first semiconductor material that provides each first sacrificial semiconductor material layer 12L and the second semiconductor material that provides each first semiconductor channel material layer 14L. In one example, the third semiconductor material that provides the placeholder semiconductor material layer 16L is composed of a silicon germanium alloy having a germanium content from 45 atomic percent to 70 atomic percent.

The second material stack MS2 includes alternating second sacrificial semiconductor material layers 18L and second semiconductor channel material layers 20L. In the illustrated embodiment, the second material stack MS2 includes "m" number of second semiconductor channel material layers 20L and "m" number of second sacrificial semiconductor material layers 18L, wherein m is an integer starting at 1; typically m is 2 or more. In the illustrated embodiment, m is 3 thus there are three second semiconductor channel material layers 20L and three second sacrificial semiconductor material layers 18L present in the second material stack MS2 illustrated in FIGS. 2A-2B.

In the present application, each second sacrificial semiconductor material layer 18L is composed of the first semiconductor material, while each second semiconductor channel material layer 20L is composed of a fourth semiconductor material that is compositionally different from the first semiconductor material and the third semiconductor material. The fourth semiconductor semiconductor material. In the present application, the fourth semiconductor material includes one of the semiconductor materials mentioned above for the semiconductor substrate 10. In some embodiments, the fourth semiconductor material that provides each second semiconductor channel material layer 20L is compositionally different from the second semiconductor material that provides each first semiconductor channel material layer 14L and in such an embodiment, the second semiconductor material can provide high channel mobility for nFETs, and the fourth semiconductor material can provide high channel mobility for pFETs. In some embodiments, the fourth semiconductor material that provides each second semiconductor channel material layer 20L is compositionally different from the second semiconductor material that provides each first semiconductor channel material layer 14L and in such an embodiment, the second semiconductor material can provide high channel mobility for p-type FET devices, and the fourth semiconductor material can provide high channel mobility for n-type FET devices. In some embodiments, each second sacrificial semiconductor material layer 18L is composed of a silicon germanium alloy having a germanium content from 20 atomic percent to 40 atomic percent, and each second semiconductor channel material layer 20L is composed of silicon. Other combinations of semiconductor materials are possible as long as the first semiconductor material that provides each second sacrificial semiconductor material layer 18L is compositionally different from the fourth semiconductor material that provides each second semiconductor channel material layer 20L.

The exemplary semiconductor structure illustrated in FIGS. 2A-2B can be formed by first forming the first material stack MS1 on the semiconductor substrate 10. The first material stack MS1 can be formed utilizing a first deposition process that includes, but is not limited to, chemical vapor deposition (CVD), plasma enhanced chemical vapor deposition (PECVD), epitaxial growth or any combination thereof. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The placeholder semiconductor material layer 16L can be formed by a second deposition process that includes, but is not limited to, CVD, PECVD, or epitaxial growth. In some embodiments, in which the first material stack MS1 is deposited to include an equal number of first sacrificial semiconductor material layers 12L and first semiconductor channel material layers 20L, the topmost first semiconductor channel material layer can be removed from the as deposited first material stack MS1 prior to forming the placeholder semiconductor material layer 16L such that the placeholder semiconductor material layer 16L is formed in contact with one of the first sacrificial semiconductor material layers 12L of the first material stack MS1.

The second material stack MS21 can be formed by a third deposition process that includes, but is not limited to, CVD, PECVD, epitaxial growth or any combination thereof.

Figure 3B:
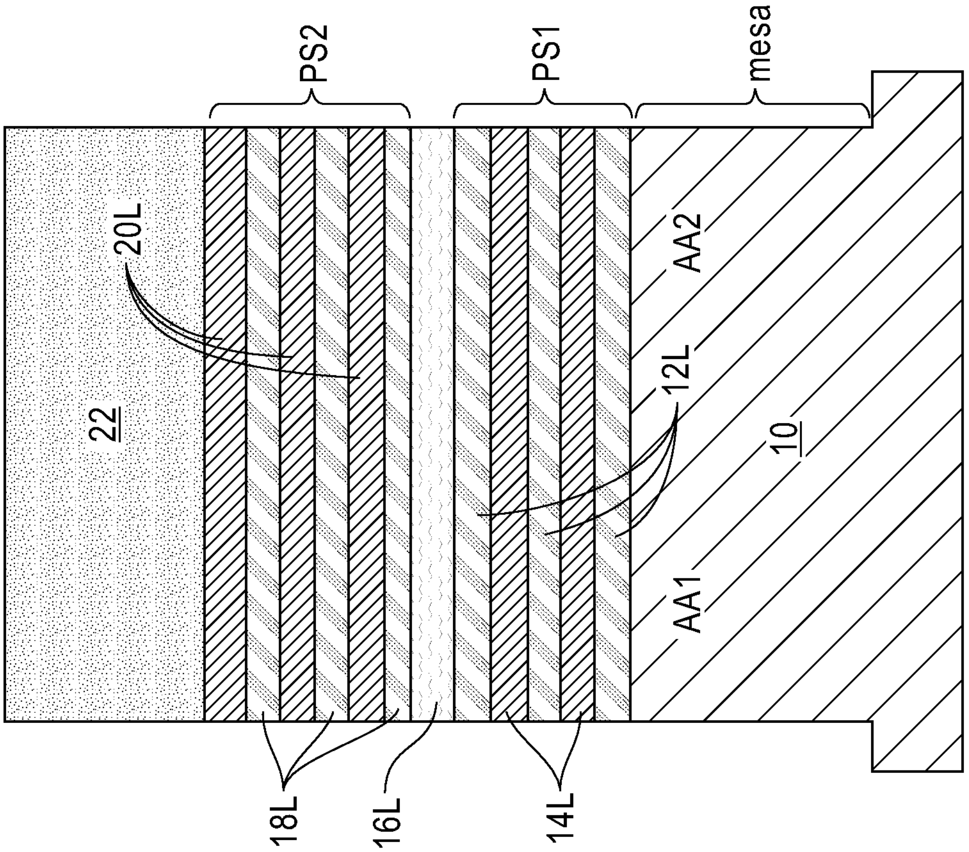
FIGS. 3A and 3B are cross-sectional views of the exemplary semiconductor structure shown in FIGS. 2A and 2B, respectively, after forming a hard mask layer and performing a first patterning process to provide a fin structure on a mesa portion of the semiconductor substrate, the fin structure including a remaining portion of the first material stack, a remaining portion of the placeholder semiconductor material layer, and a remaining portion of the second material stack.
Figure 3A:
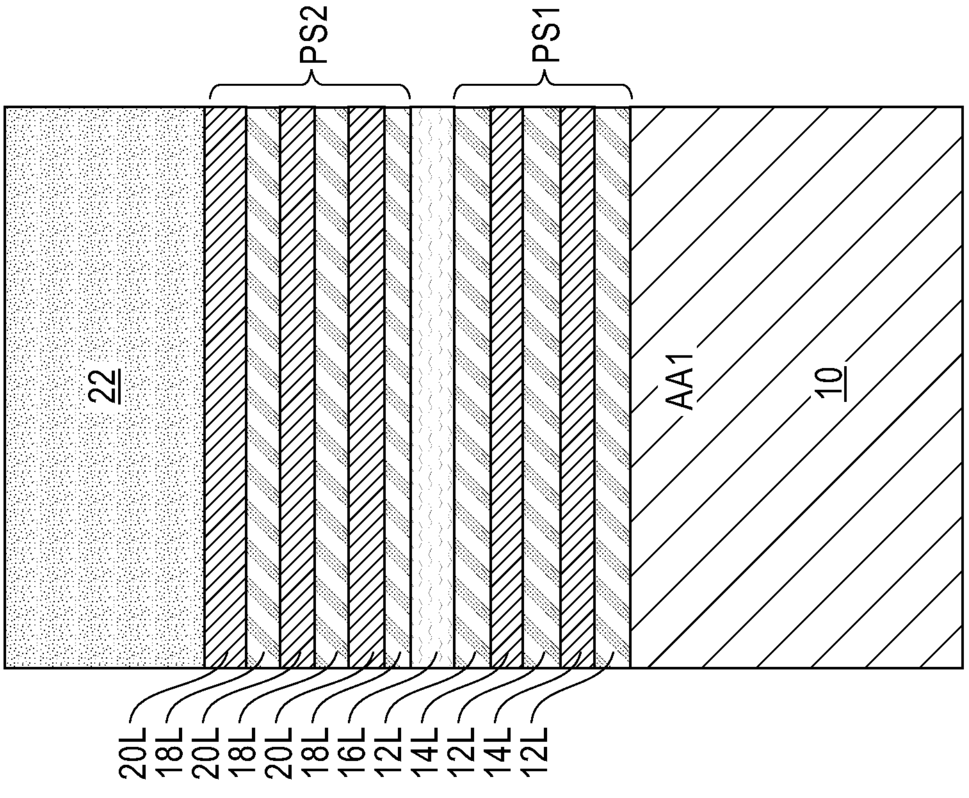

Referring now to FIGS. 3A and 3B, there are illustrated the exemplary semiconductor structure shown in FIGS. 2A and 2B, respectively, after forming a hard mask layer and performing a first patterning process to provide a fin structure on a mesa portion of the semiconductor substrate 10. A patterned hard mask layer 22 is formed on the fin structure during this first patterning process. The term "mesa portion" denotes a portion of a material layer/structure that is non-etched and raised above an etch portion of the same material layer/structure. Although FIGS. 3A-3B show the formation of a single fin structure, a plurality of such fin structures can be formed.

The fin structure includes a remaining (i.e., non-unetched) portion of the first material stack MS1, a remaining (i.e., non-unetched) portion of the placeholder semiconductor material layer 16L, and a remaining (i.e., non-unetched) portion of the second material stack MS2. The remaining (i.e., non-unetched) portion of the first material stack MS1 can be referred to herein as a patterned first material stack PS1 and the remaining (i.e., non-unetched) portion of the second material stack MS1 can be referred to herein as a patterned second material stack PS2.

The patterned hard mask layer 22 is composed of a hard mask material such as, for example, silicon dioxide, silicon nitride and/or silicon oxynitride. The patterned hard mask layer 22 can be formed by depositing a hard mask layer composed of a hard mask material on the physically exposed topmost surface of the second material stack MS2 depicted in FIGS. 2A-2B. The deposition of the hard mask material includes, for example, CVD, PECVD, or physical vapor deposition (PVD). The as-deposited hard mask layer is patterned by the first patterning process to provide the patterned hard mask layer 22 on top of the fin structure.

The first patterning process includes lithography and etching. Lithography includes forming a photoresist material (not shown) on a material layer or stack of material layers that need to be patterned, exposing the photoresist material to a pattern of irradiation and developing the exposed photoresist material. The etch used in the first patterning process includes dry etching (i.e., one or reactive ion etching (RIE), ion beam etching (IBE) or plasma etching), wet etching (this includes the uses of a chemical etchant) or a combination of dry etching and wet etching. In the present application, the etch is typically a RIE. The etch first removes portion of the as-deposition hard mask layer that is not protected by the developed photoresist material. The etch continues entirely through non-protected portions of each of the second material stack MS2, the placeholder semiconductor material layer 16L and the first material stack MS1, and the etch partially removes the semiconductor substate 10 to provide a mesa as is shown in FIG. 3B. The developed photoresist can be removed anytime the pattern has been transferred into at least the as-deposited hard mask layer.

Figure 4B:
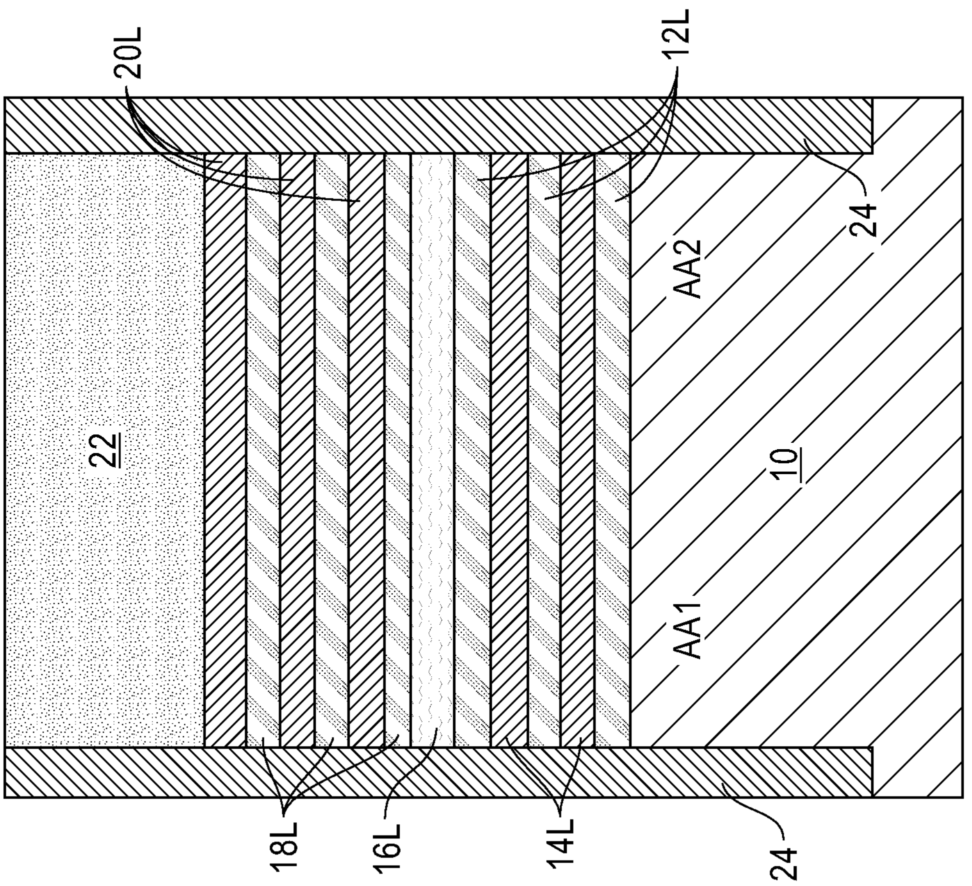
FIGS. 4A and 4B are cross-sectional views of the exemplary semiconductor structure shown in FIGS. 3A and 3B, respectively, after forming a first interlayer dielectric (ILD) layer adjacent to the mesa portion of the semiconductor substrate and the fin structure.
Figure 4A:
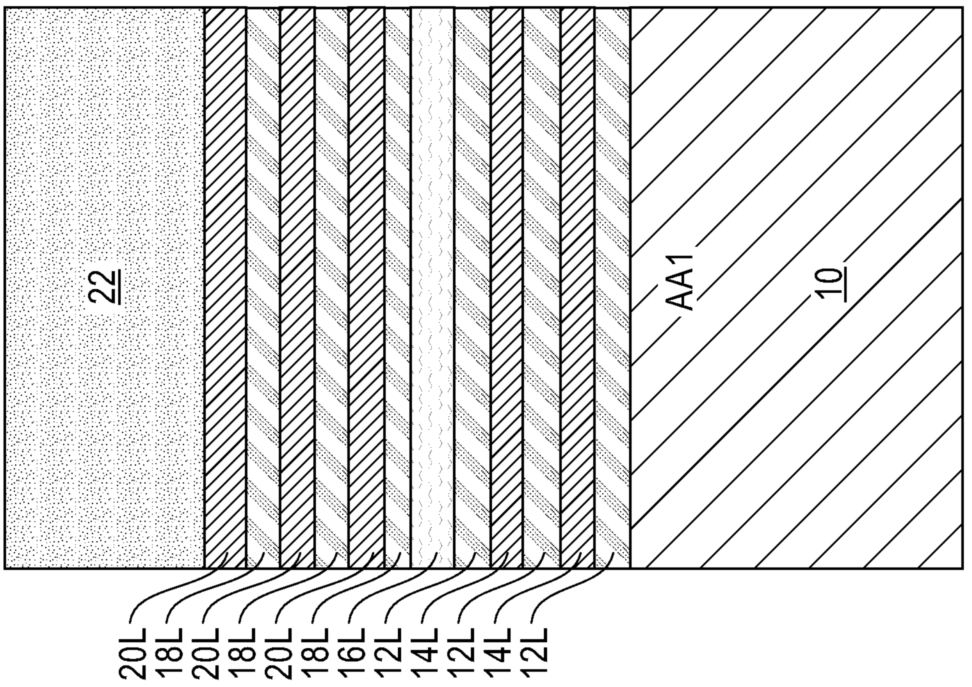

Referring now to FIGS. 4A and 4B, there is illustrated the exemplary semiconductor structure shown in FIGS. 3A and 3B, respectively, after forming a first interlayer dielectric (ILD) layer 24 adjacent to the mesa portion of the semiconductor substrate 10 and the fin structure. The first ILD layer 24 is also formed adjacent to the patterned hard mask layer 22. The first ILD layer 24 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted). The first ILD layer 24 can be formed by a deposition process including, but not limited to, CVD, PECVD or spin-on coating. A planarization process such as, for example, chemical mechanical polishing (CMP) follows the deposition process. At this point of the present application, the first ILD layer 24 is substantially coplanar with a topmost surface of the patterned hard mask layer 22. The term "substantially coplanar" denotes that one material layer has a topmost surface that is within +10 nm from a topmost surface of another material layer.

Figure 5B:
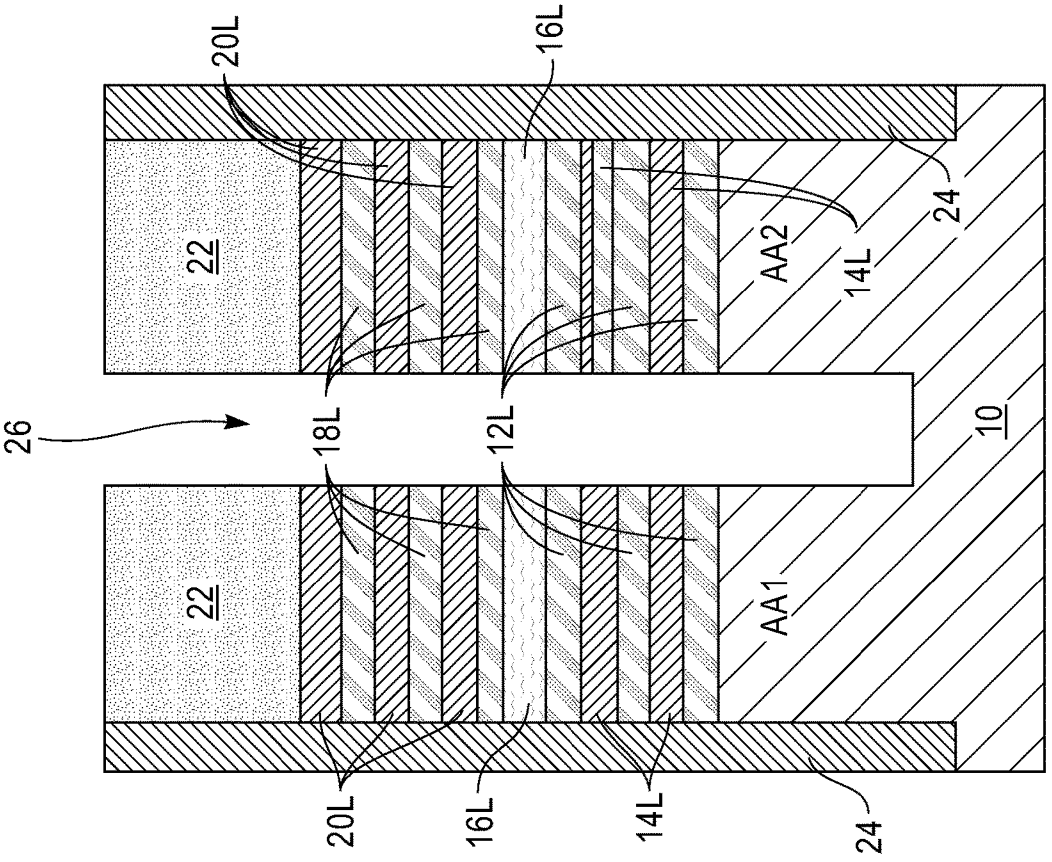
FIGS. 5A and 5B are cross-sectional views of the exemplary semiconductor structure shown in FIGS. 4A and 4B, respectively, after performing a second patterning process to provide fin cut structures having a narrower width than the original width of the fin structure.
Figure 5A:
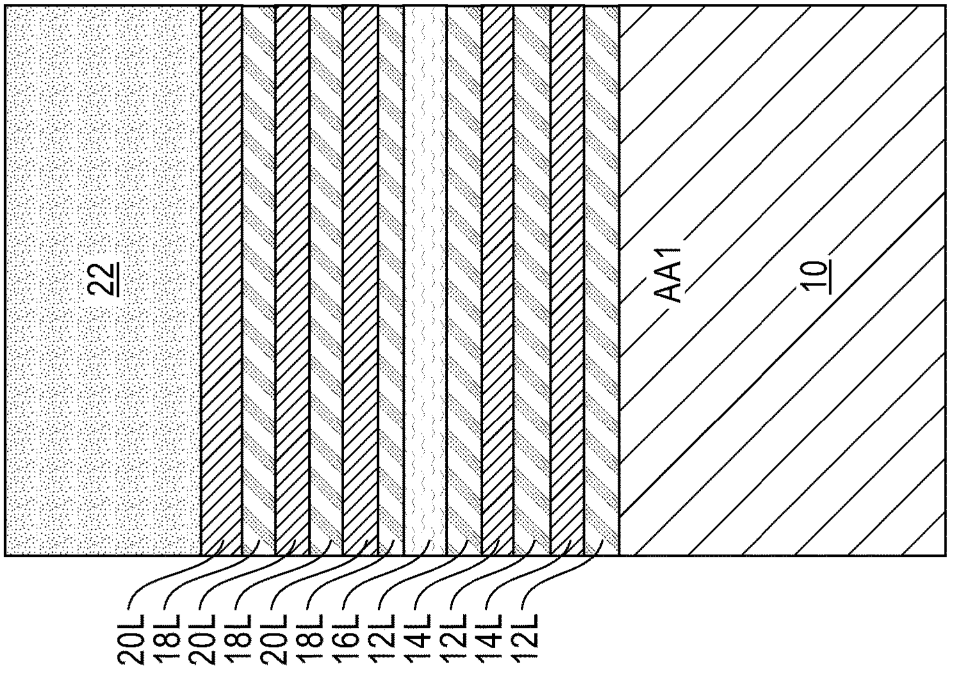

Referring now to FIGS. 5A and 5B, there are illustrated the exemplary semiconductor structure shown in FIGS. 4A and 4B, respectively, after performing a second patterning process to provide fin cut structures having a narrower width than the original width of the fin structure. Each fin cut structure includes a remaining portion of the patterned second material stack MS2, a remaining portion of the sacrificial semiconductor material layer 16L and a remaining portion of the patterned first material stack MS1. The second patterning process is performed by lithography and etching as defined above for the first patterning process. The second patterning process forms an opening 26 between the fin cut structures and defines a first active area AA1 and a second active area AA2 as shown, for example, in FIG. 5B. Opening 26 reveals sidewalls of the remaining (i.e., non-etched) portion of the placeholder semiconductor material layer 16L of each fin cut structure.

Figure 6B:
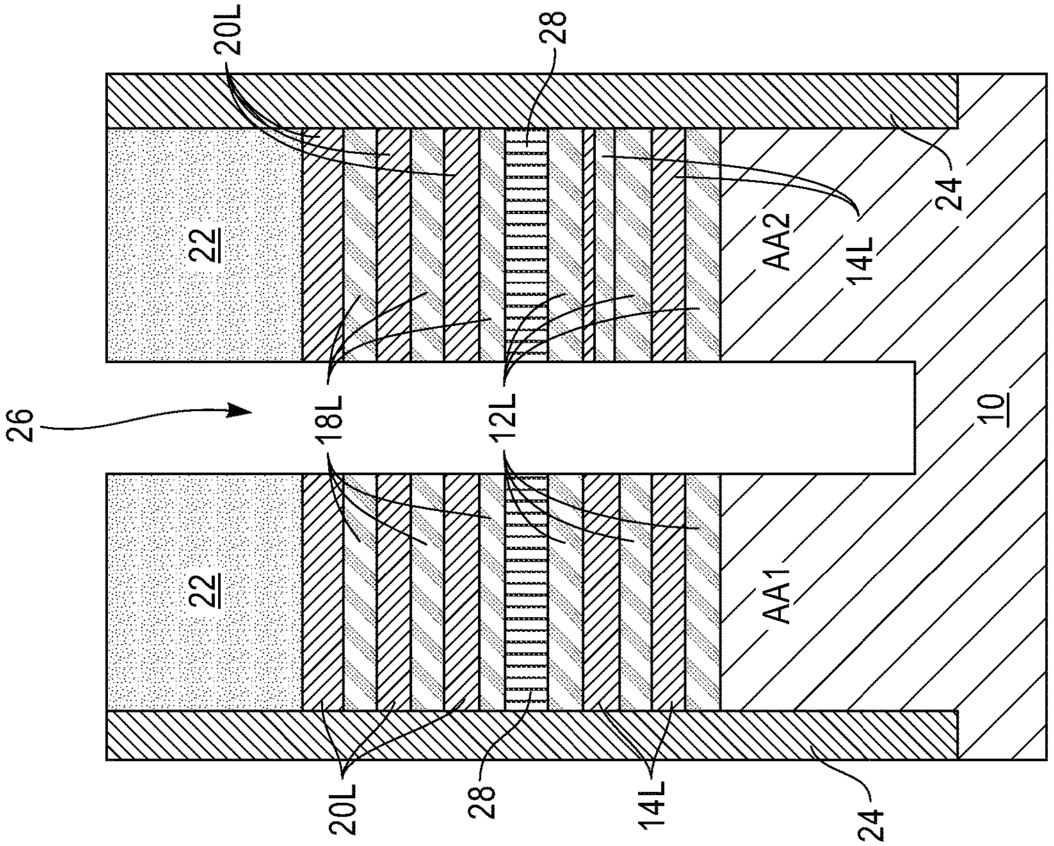
FIGS. 6A and 6B are cross-sectional views of the exemplary semiconductor structure shown in FIGS. 5A and 5B, respectively, after replacing the placeholder semiconductor material layer of each fin cut structure with a middle dielectric isolation layer.
Figure 6A:
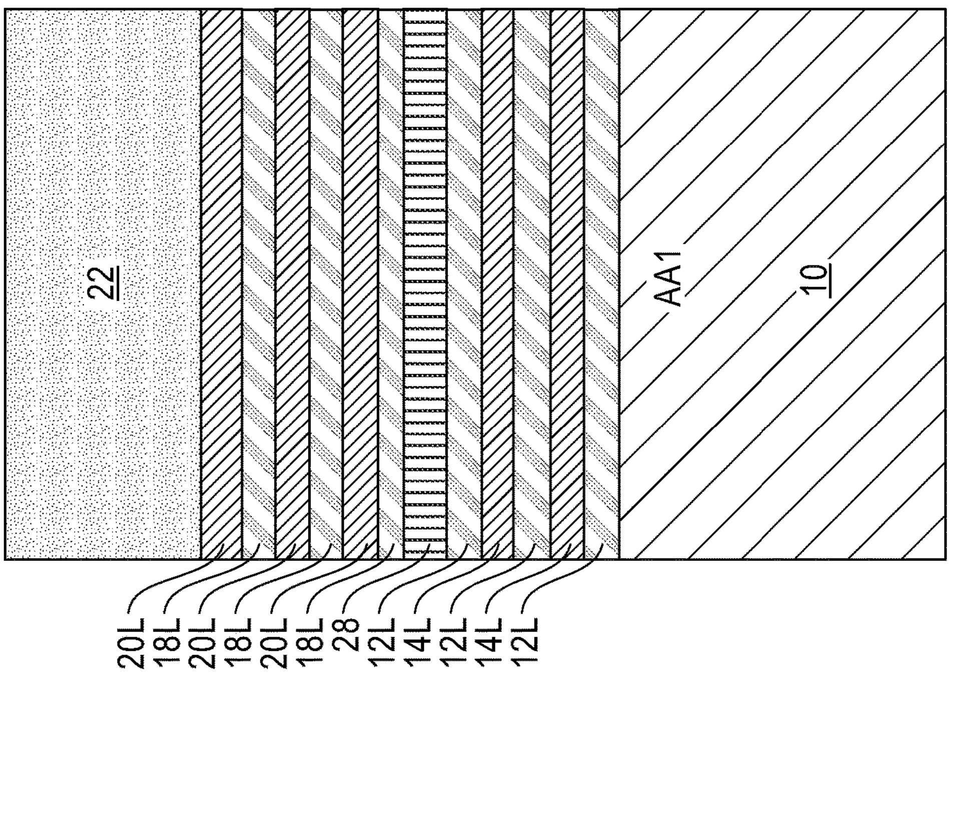

Referring now to FIGS. 6A and 6B, there are illustrated the exemplary semiconductor structure shown in FIGS. 5A and 5B, respectively, after replacing the placeholder semiconductor material layer 16L of each fin cut structure with a middle dielectric isolation layer 28. The removal of placeholder semiconductor material layer 16L includes an etching process that is selective in removing the third semiconductor material that provides the placeholder semiconductor material layer 16L. This etching process provides a gap between the patterned first material stack PS1 and the patterned second material stack PS2 of each fin cut structure. The gap is then filled with a dielectric material such as, for example, silicon dioxide, SiN, SiBCN, SiOCN or SiOC. The filling includes a conformal deposition process such as, for example atomic layer deposition (ALD), followed by an etch. The etch removes the dielectric material that is formed outside the gap and forms the middle dielectric isolation layer 28 between the patterned first material stack PS1 and the patterned second material stack PS2 of each fin cut structure.

Figure 7B:
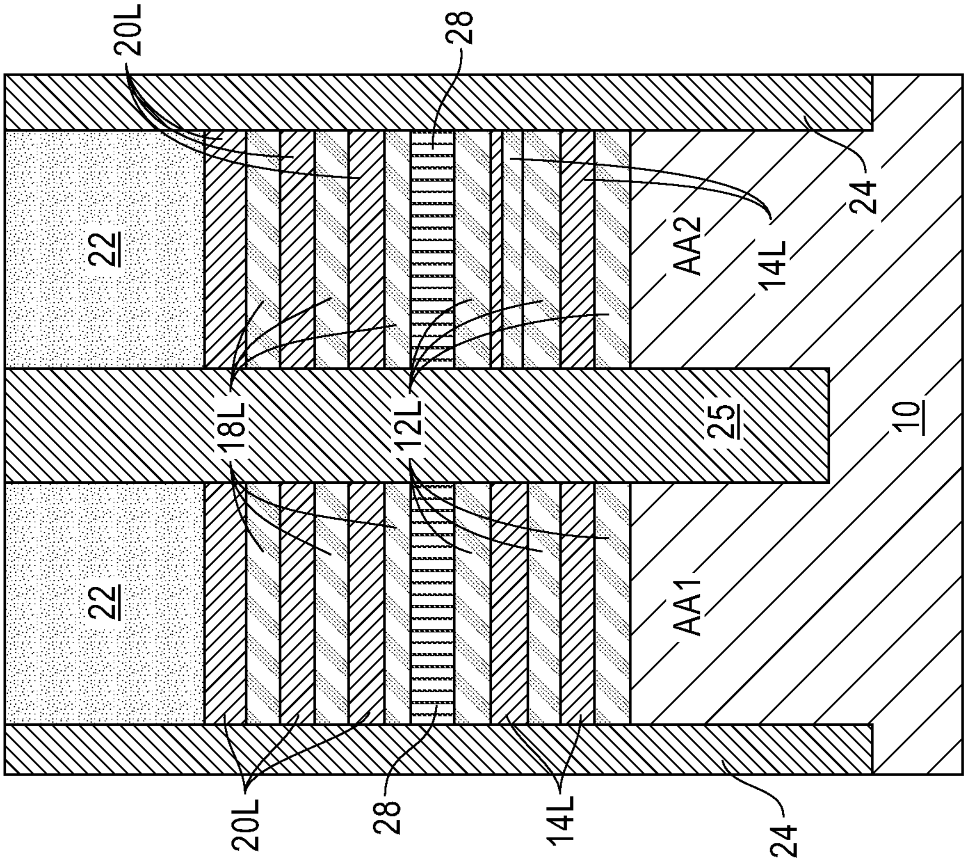
FIGS. 7A and 7B are cross-sectional views of the exemplary semiconductor structure shown in FIGS. 6A and 6B, respectively, after forming a second ILD layer.
Figure 7A:
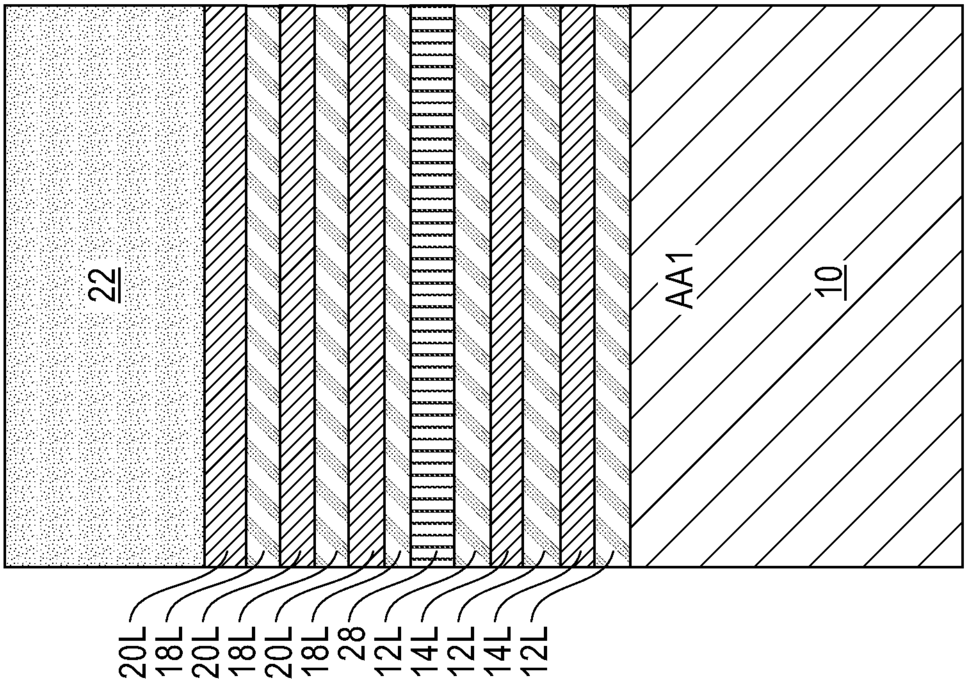

Referring now to FIGS. 7A and 7B, there are illustrated the exemplary semiconductor structure shown in FIGS. 6A and 6B, respectively, after forming a second ILD layer 25. The second ILD layer 25 is formed in opening 26 that is present between each fin cut structure. The second ILD layer 25 includes one of the dielectric materials mentioned above for the first ILD layer 24. The dielectric material that provides the second ILD layer 25 can be compositionally the same as, or compositionally different from, the dielectric material that provides the first ILD layer 24. The second ILD layer 25 can be formed utilizing the technique mentioned above in forming the first ILD layer 24. The second ILD layer 25 has a topmost surface that is substantially coplanar with a topmost surface of the patterned hard mask layer 22 that is present on top of each fin cut structure.

Figure 8B:
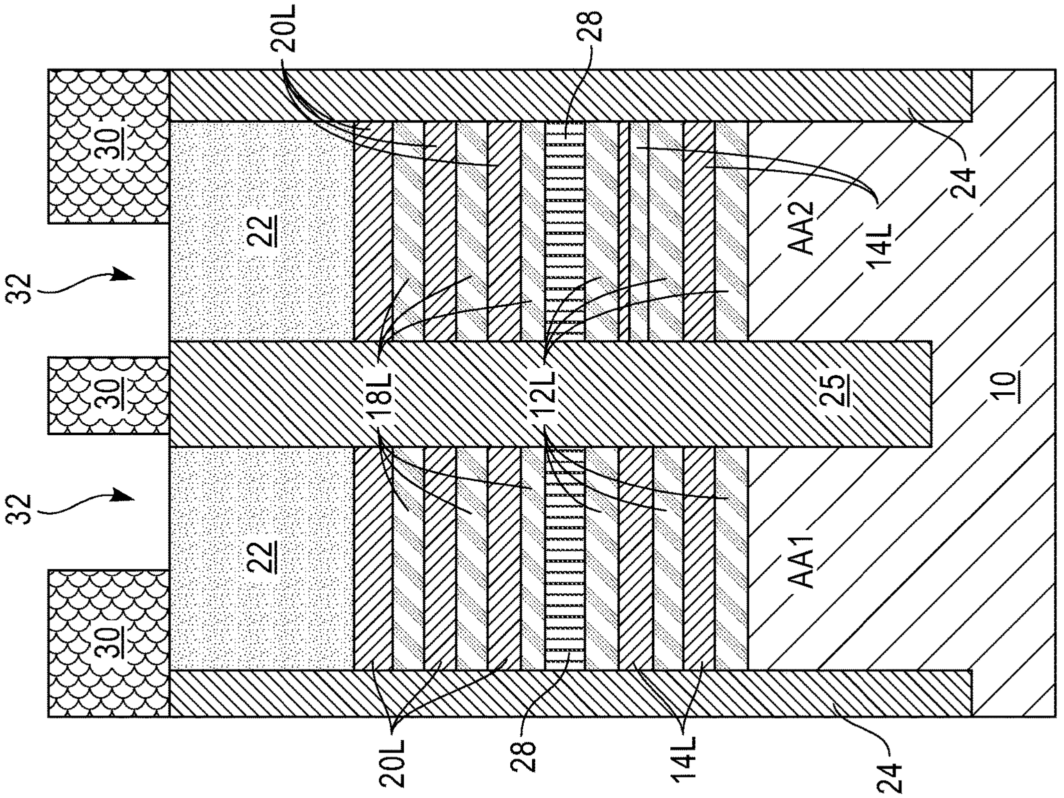
FIGS. 8A and 8B are cross-sectional views of the exemplary semiconductor structure shown in FIGS. 7A and 7B, respectively, after forming a patterned organic planarization layer (OPL) having openings formed therein.
Figure 8A:
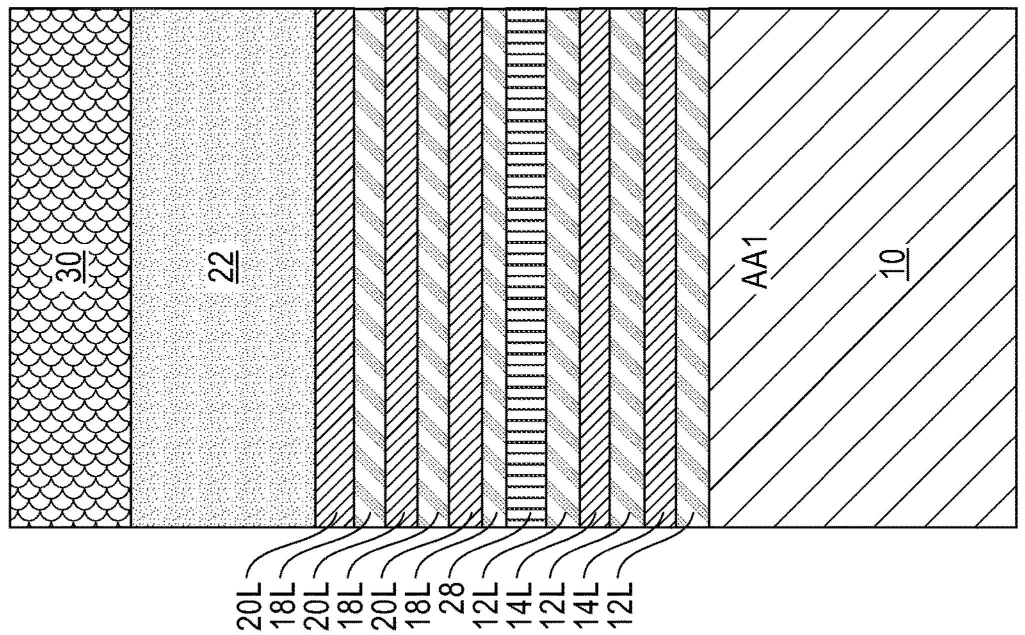

Referring now to FIGS. 8A and 8B, there are illustrated the exemplary semiconductor structure shown in FIGS. 7A and 7B, respectively, after forming a patterned OPL 30 having openings 32 formed therein. Each opening 32 physically exposes a portion of the patterned hard mask layer 22 that is present on each fin cut structure as shown in FIG. 8B. The patterned OPL layer 30 can be formed by deposition of an organic planarization material, followed by lithographic patterning to form openings 32 therein.

Figure 9B:
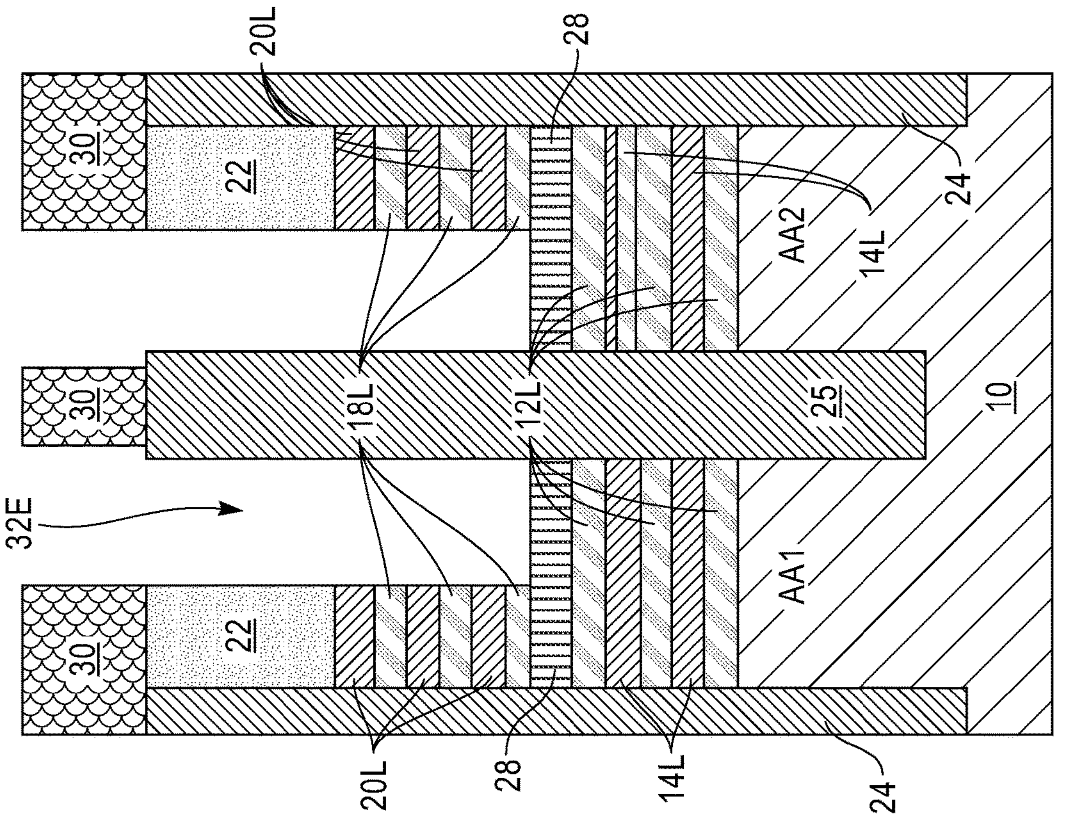
FIGS. 9A and 9B are cross-sectional views of the exemplary semiconductor structure shown in FIGS. 8A and 8B, respectively, after cutting the patterned second material stack of each fin cut structure to reveal a portion of the middle dielectric isolation layer.
Figure 9A:
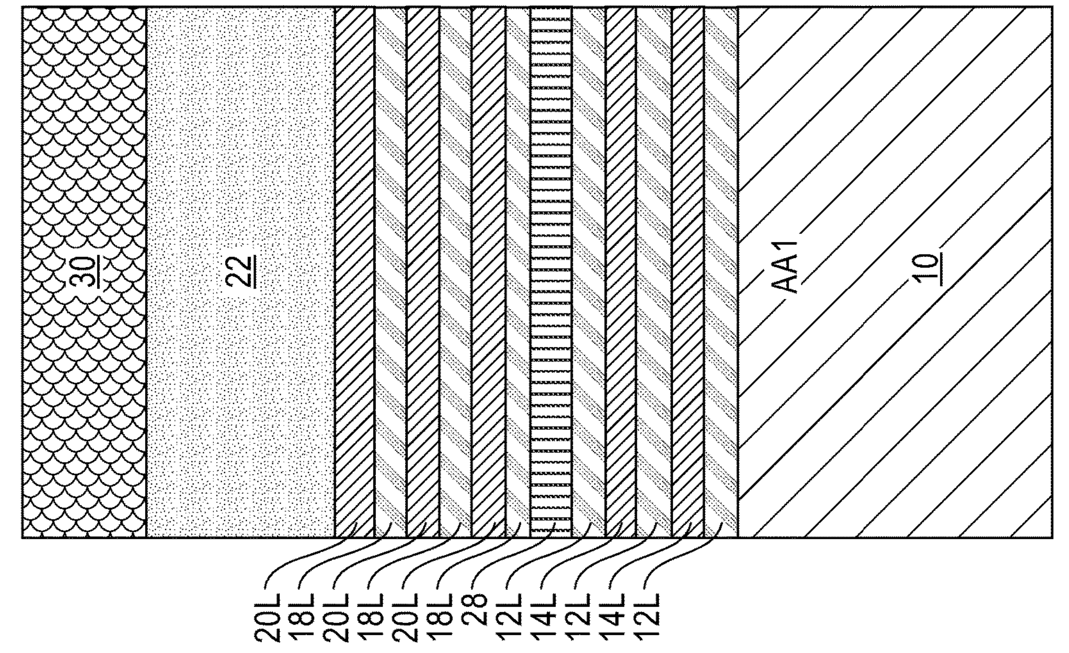

Referring now to FIGS. 9A and 9B, there are illustrated the exemplary semiconductor structure shown in FIGS. 8A and 8B, respectively, after cutting the patterned second material stack PS2 of each fin cut structure to reveal a portion of the middle dielectric isolation layer 28. The cutting includes an etching process that removes portions of each patterned second material stack PS2 that is physically exposed by one of the openings 32. The etch extends the openings 32 and forms extending openings 32 in the structure as shown in FIG. 9B. At this point of the present application, the remaining patterned second material stack PS2 of each fin cut structure has a width that is less than a width of the underlying patterned first material stack PS1 of each fin cut structure.

Figure 10B:
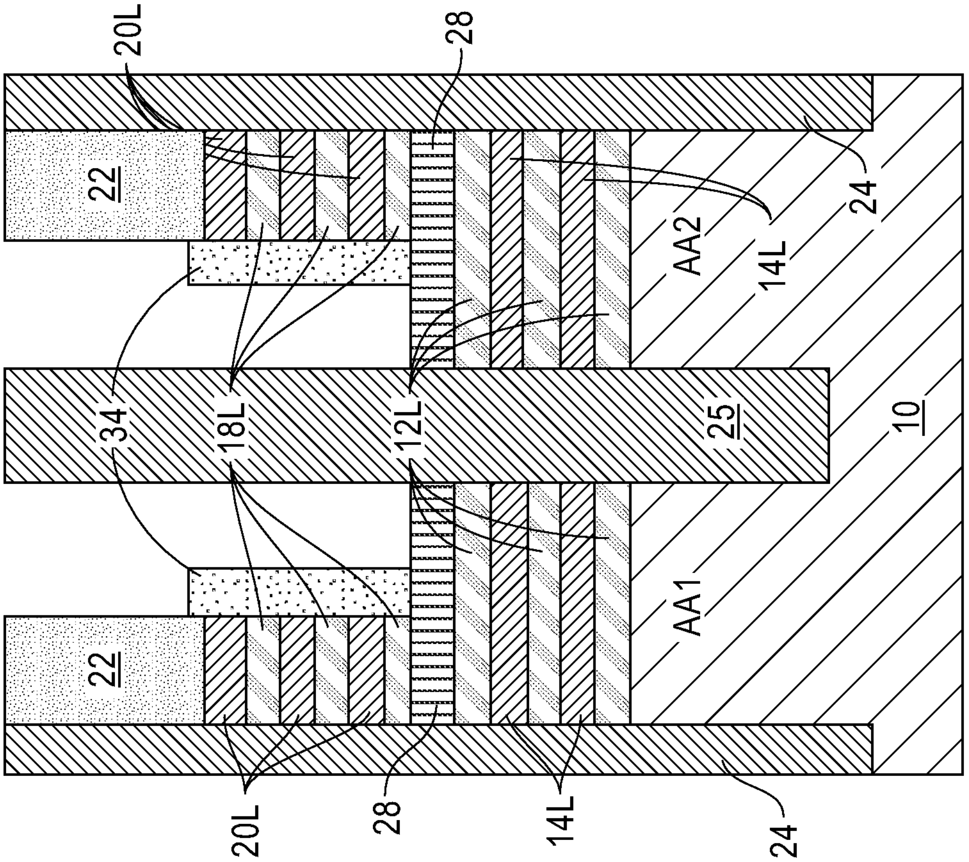
FIGS. 10A and 10B are cross-sectional views of the exemplary semiconductor structure shown in FIGS. 9A and 9B, respectively, after removing the patterned OPL and forming a sacrificial semiconductor material pillar on the revealed portion of the middle dielectric isolation layer and on a physically exposed sidewall of each fin cut structure.
Figure 10A:
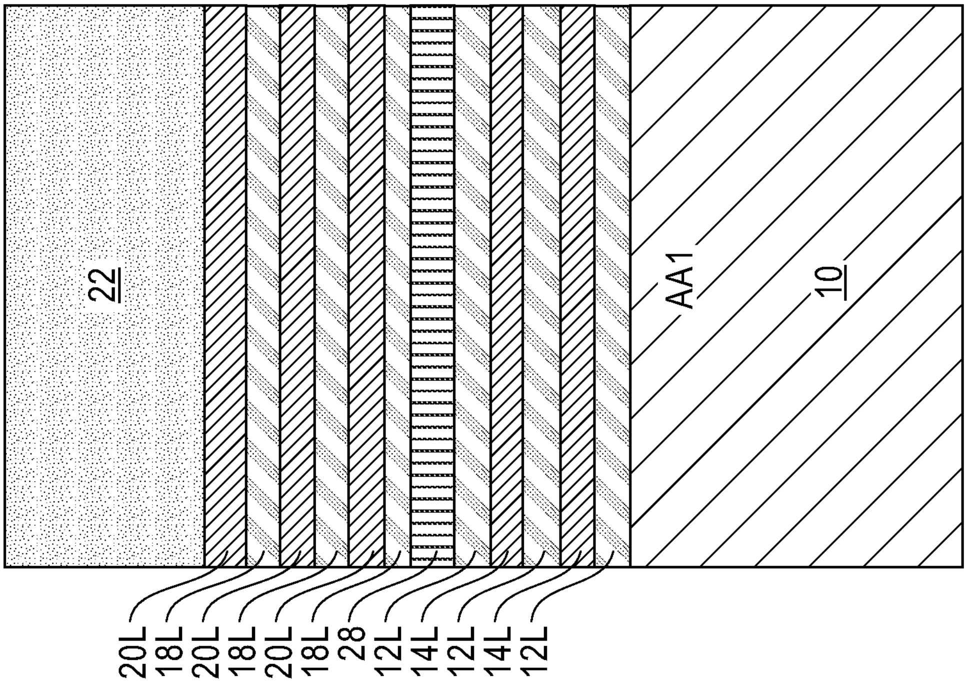

Referring now to FIGS. 10A and 10B, there are illustrated the exemplary semiconductor structure shown in FIGS. 9A and 9B, respectively, after removing the patterned OPL 30 and forming a sacrificial semiconductor material pillar 34 on the revealed portion of the middle dielectric isolation layer 28 and on a physically exposed sidewall of each fin cut structure. The removal of the patterned OPL 30 can be performed utilizing a material removal process such as, for example, etching or planarization that is selective in removing the OPL 30. The sacrificial semiconductor material pillar 34 is formed utilizing an epitaxial growth process as mentioned above. The sacrificial semiconductor material pillar 34 is grown outward from the physically exposed sidewall of the patterned second material stack PS2 of each fin cut structure. The sacrificial semiconductor material pillar 34 is composed of the same semiconductor material, i.e., the first semiconductor material, as the second sacrificial semiconductor material layers 18L. The sacrificial semiconductor material pillar 34 can have a height that is slightly above the topmost surface of each fin cut structure, coplanar with the topmost of each fin cut structure, or slightly below the topmost surface of each fin cut structure. Note that the sacrificial semiconductor material pillar 34 does not completely fill in the extended opening 32E and that the sacrificial semiconductor material pillar 34 is spaced apart from the second ILD layer 25. The sacrificial semiconductor material pillar 34 will define an area for subsequent formation of the self-aligned gate extension for a top FET device.

Figure 11A:
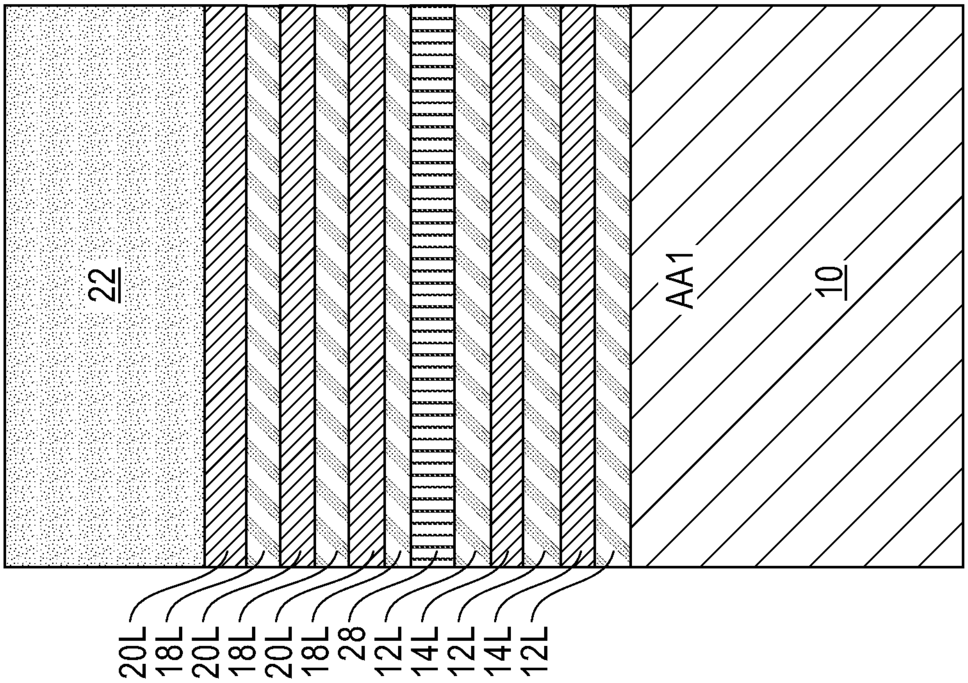
FIGS. 11A and 11B are cross-sectional views of the exemplary semiconductor structure shown in FIGS. 10A and 10B, respectively, after forming a dielectric pillar adjacent to the sacrificial semiconductor material pillar.
Figure 11B:
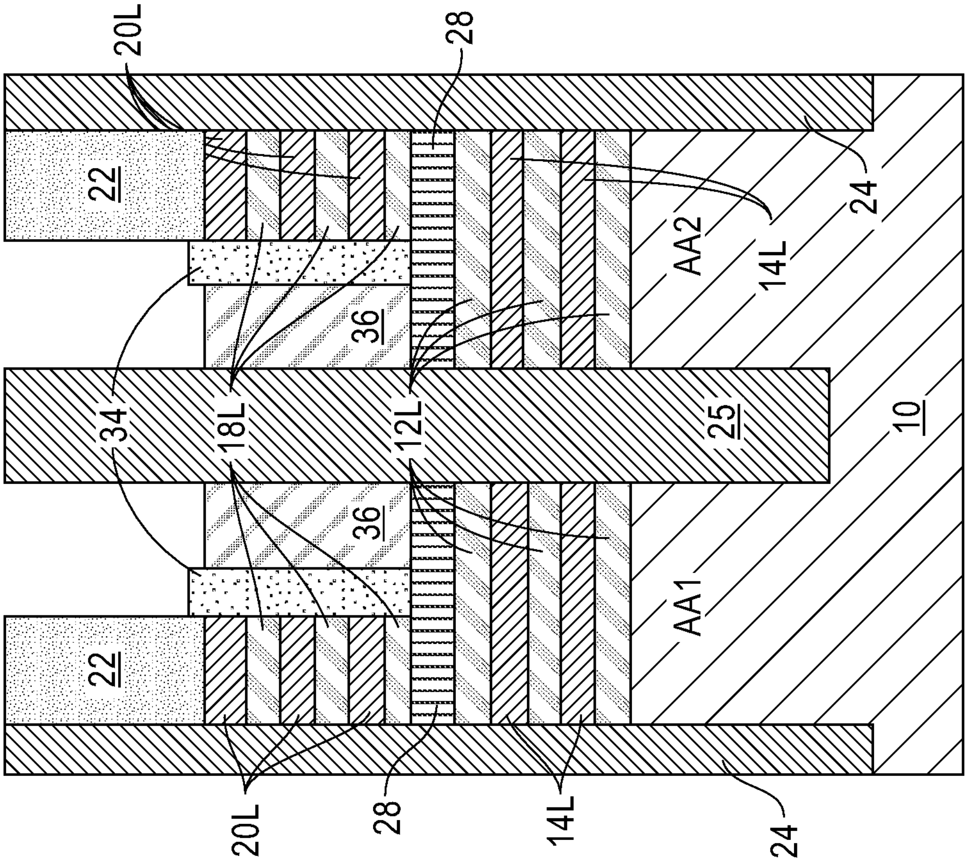

Referring now to FIGS. 11A and 11B, there are illustrated the exemplary semiconductor structure shown in FIGS. 10A and 10B, respectively, after forming a dielectric pillar 36 adjacent to the sacrificial semiconductor material pillar 34. The dielectric pillar 36 is composed of a dielectric material that is compositionally different from hard mask material that provides the hard mask layer 22 and different from the dielectric material that provides the first and second ILD layers 24, 25. The dielectric pillar 36 can be composed of a compositionally same, or compositionally different, dielectric material as the middle dielectric isolation layer 28. In embodiments, the dielectric pillar 36 can be composed of, for example, SiC, SiN, SiBCN, SiOCN or SiOC. The dielectric pillar 36 can be formed by a deposition process such as, for example, CVD or PECVD. In some embodiments, a recess etch can follow the deposition process. The dielectric pillar 36 is formed laterally adjacent to, and in physical contact with each of sacrificial semiconductor material pillar 34 and the second ILD layer 25. The dielectric pillar 36 is formed on a remaining portion of the revealed portion of the middle dielectric isolation layer 28. The dielectric pillar 36 can have a height that is equal to, or less than, the height of the sacrificial semiconductor material pillar 34.

Figure 12B:
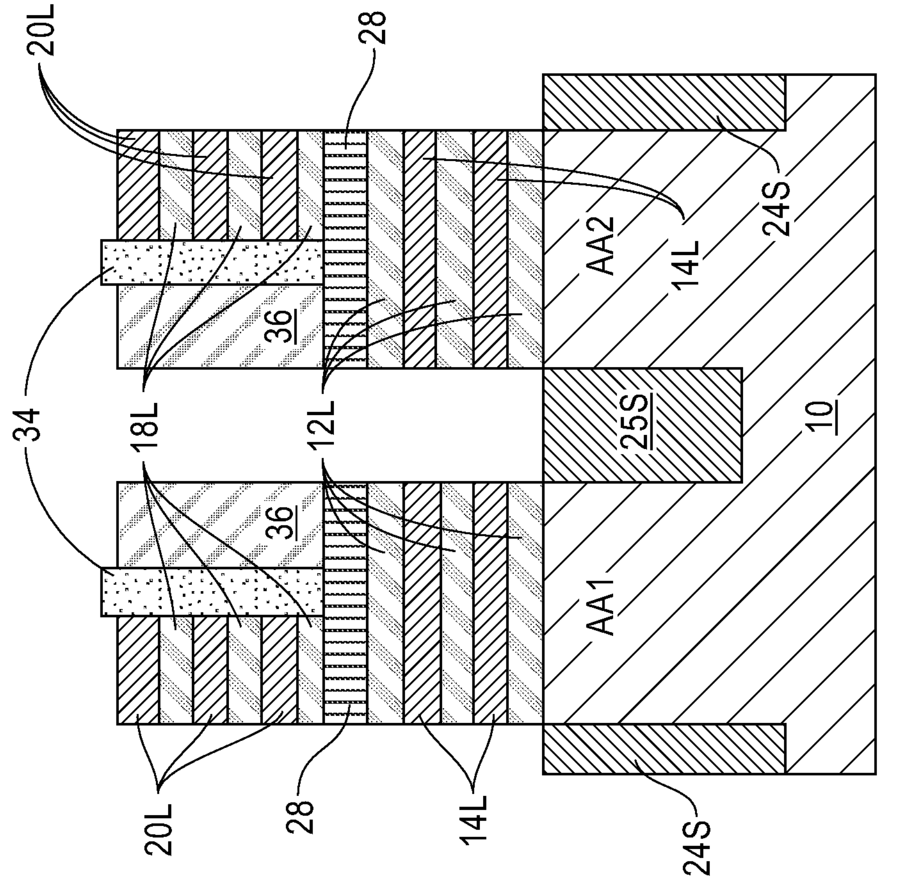
FIGS. 12A and 12B are cross-sectional views of the exemplary semiconductor structure shown in FIGS. 11A and 11B, respectively, after removing the patterned hard mask layer and reducing the height of the first and second ILD layers to reveal each fin cut structure.
Figure 12A:
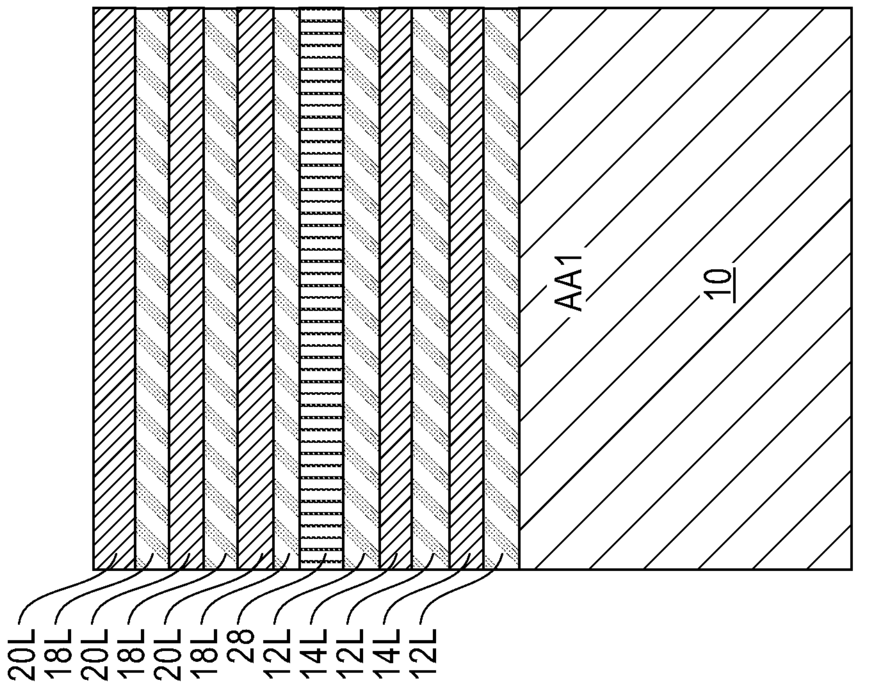

Referred now to FIGS. 12A and 12B, there are illustrated the exemplary semiconductor structure shown in FIGS. 11A and 11B, respectively, after removing the patterned hard mask layer 22 and reducing the height of the first and second ILD layers 24, 25 to reveal each fin cut structure. The removal of the patterned hard mask layer 22 and the reducing of the height of the first and second ILD layers 24, 25 can be performed in any order. For example and in one embodiment, the removal of the patterned hard mask layer 22 occurs prior to the reducing of the height of the first and second ILD layers 24, 25. In another embodiment, the reducing of the height of the first and second ILD layers 24, 25 occur prior to the removal of the patterned hard mask layer 22.

In either embodiment, the removal of the patterned hard mask layer 22 includes a material removal process such as, an etch or a planarization process, which is selective in removing the patterned hard mask layer 22 from the structure. The reducing of the height of the first and second ILD layers 24, 25 can be performed utilizing a recess etching process A single recess etch can be used when the first and second ILD layers 24, 25 are composed of a compositionally same dielectric material. When the first and second ILD layers 24, 25 are composed of compositionally different dielectric materials, multiple recess etching processes can be used to reduce the height of each of the first and second ILD layers 24, 25. The reducing of the height of the first ILD layer 24 provides a first shallow trench isolation structure 24S and the reducing of the height of the second ILD layer 25 provides a second shallow trench isolation structure 25S. The first and second shallow trench isolation structures 24S, 25S have a topmost surface that is either coplanar with the topmost surface of the mesa portion of the semiconductor substrate 10, or slightly below the topmost surface of the mesa portion of the semiconductor substrate 10.

Note that at this point of the present application, and as is shown in FIG. 12B, the width of fin cut structure plus the width of the sacrificial semiconductor material pillar 34 plus the width of the dielectric pillar equals the width of the patterned first material structure PS1.

Figure 13B:
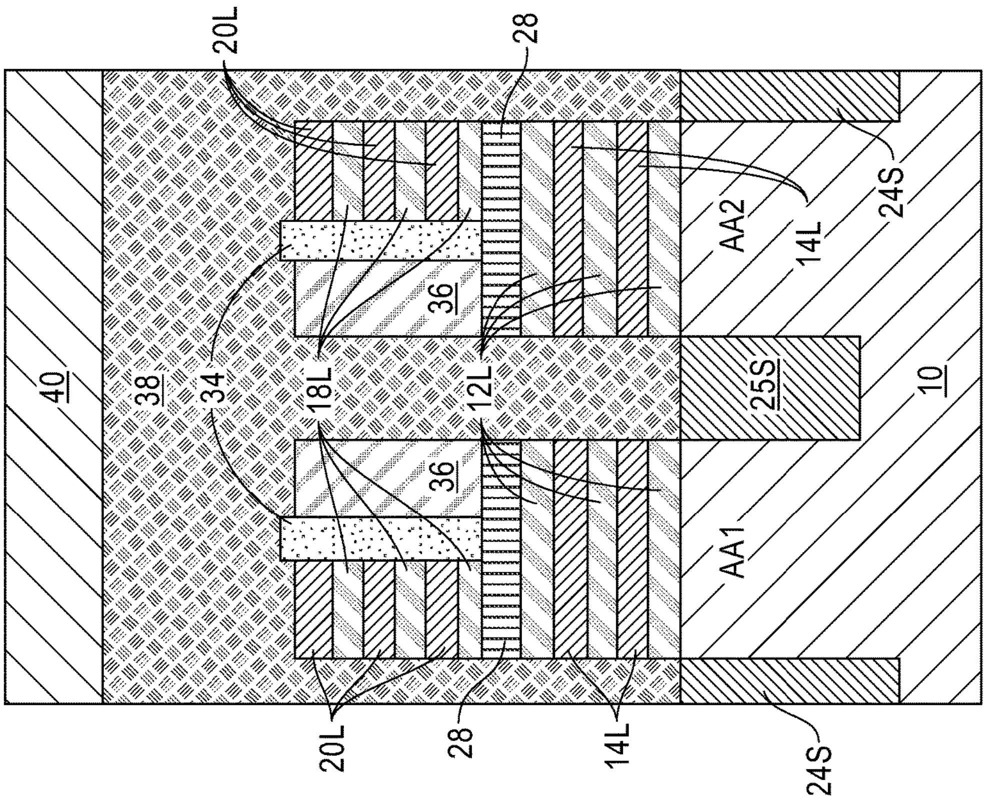
FIGS. 13A and 13B are cross-sectional views of the exemplary semiconductor structure shown in FIGS. 12A and 12B, respectively, after forming at least one sacrificial gate structure and a gate dielectric spacer on each side of the at least one sacrificial gate structure.
Figure 13A:
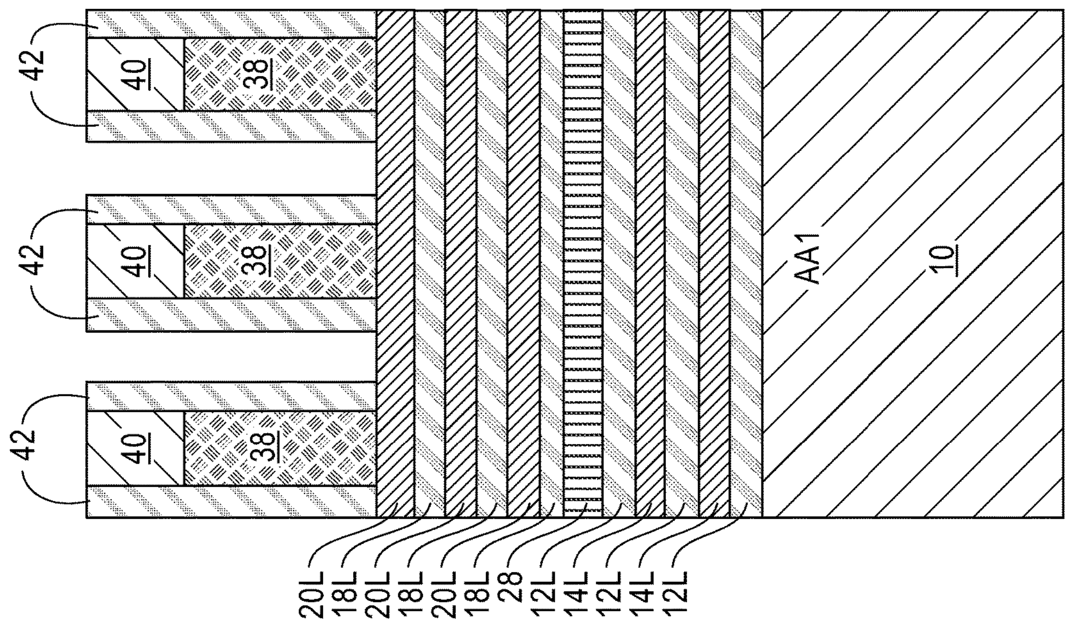
Figure 13D:
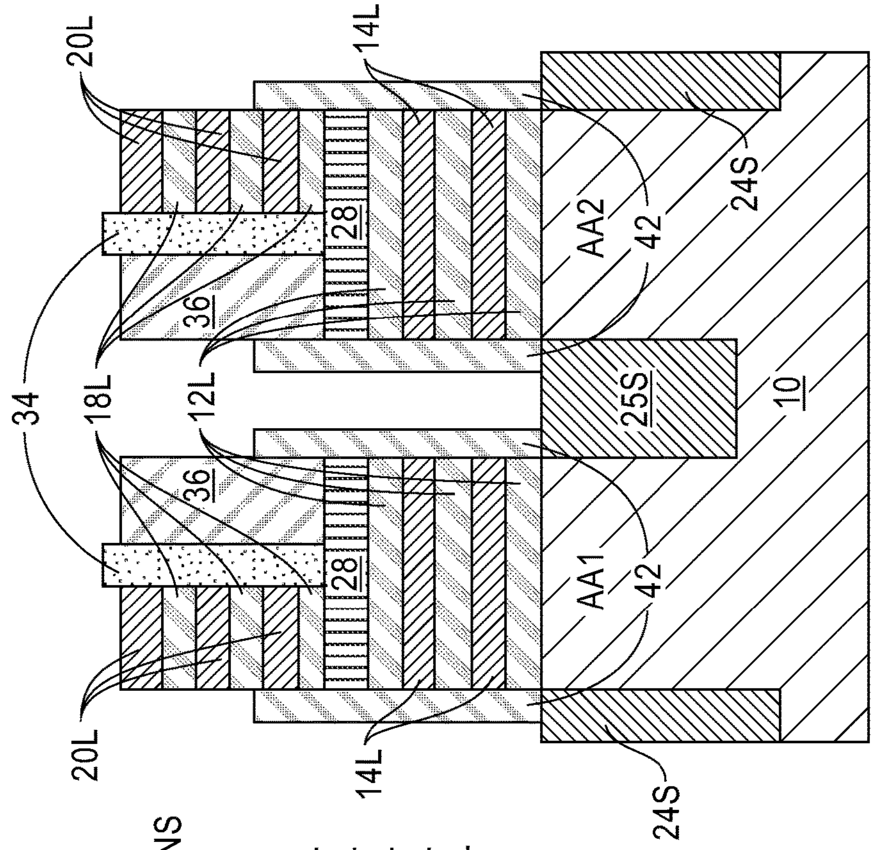
FIGS. 13C and 13D are cross-sectional views of the exemplary structure shown in FIGS. 13A and 13B corresponding to cuts C-C and D-D shown in FIG. 1, respectively.
Figure 13C:
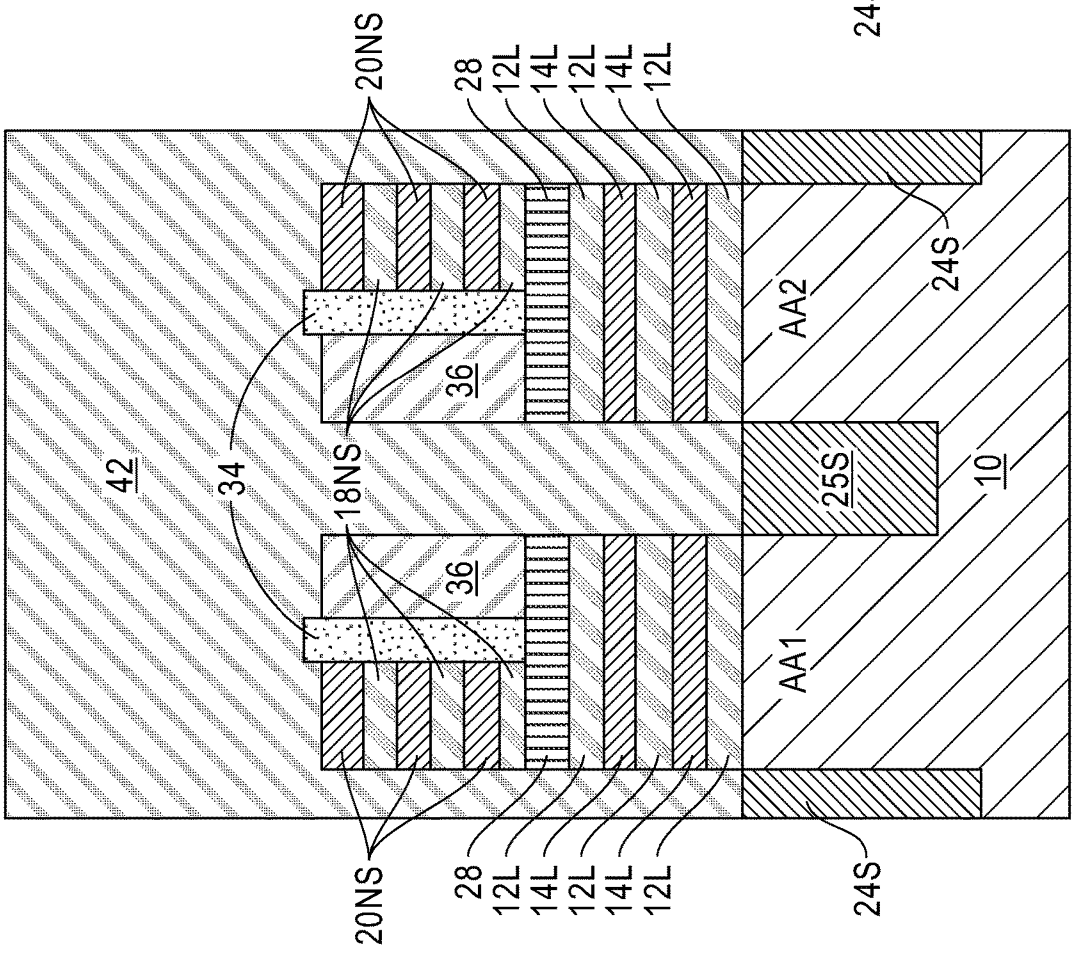

Referring now to FIGS. 13A and 13B, there are illustrated the exemplary semiconductor structure shown in FIGS. 12A and 12B, respectively, after forming at least one sacrificial gate structure 38 and a gate dielectric spacer 42 on each side of the at least one sacrificial gate structure 38. FIGS. 13C and 13D are cross-sectional views of the exemplary structure shown in FIGS. 13A and 13B corresponding to cuts C-C and D-D shown in FIG. 1, respectively. As shown in FIG. 13D, the gate dielectric spacer 42 is not formed over the patterned first material stack PS1.

In FIG. 13A, three sacrificial gate structures 38 are shown by way of one example. In some embodiments, a sacrificial gate cap 40 can be present on top of each sacrificial gate structure 38 that is formed. In embodiments where the sacrificial gate cap 40 is present, the gate dielectric spacer 42 is typically present along the sidewalls of the sacrificial gate cap 40 as is shown in FIG. 13A. In the present application, each sacrificial gate structure 38 and the gate dielectric spacers 42 straddle over at least one of the fin cut structures. The terms “straddle” or ‘straddling” denotes that one material layer/structure is located along sidewalls and atop, at least one other layer/structure.

Each sacrificial gate structure 38 includes at least a sacrificial gate material. In some embodiments, each sacrificial gate structure 38 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. The sacrificial gate cap 40 can be composed of a hard mask material such as, for example, silicon nitride or silicon oxynitride. The gate dielectric spacers 42 can be composed of any dielectric spacer material including, but not limited to, silicon dioxide, SiN, SiBCN, SiOCN or SiOC.

The structure shown in FIGS. 13A-13D can be formed by depositing (CVD, PECVD or physical vapor deposition (PVD)) blanket layers of the sacrificial gate dielectric material (if the same is present), the sacrificial gate material, and the hard mask material (if the same is present). After depositing the blanket layers, lithography and etching can be used to provide the sacrificial gate structure 38 and, if present, the sacrificial gate cap 40. The gate dielectric spacers 42 are then formed by deposition of the dielectric spacer material, followed by a spacer etch.

Referring now to FIGS. 14A-14D, there are illustrated the exemplary semiconductor structure shown in FIGS. 13A-13D, respectively, after forming a second nanosheet stack (i.e., top nanosheet stack) and removing the dielectric pillar 34 from the source/drain region. The second nanosheet stack is formed by etching utilizing the sacrificial gate structure 38 and the gate dielectric spacers 42 as a combined etch mask. The etch removes a portion of the patterned second material stack MS2 of the fin cut structure and sacrificial semiconductor material pillar 34 that are not protected by this combined etch mask. This etch stops on the surface of the middle dielectric isolation layer 28 as shown, for example, in FIG. 14A. Since the source/drain region does not include a sacrificial gate structure 38, this etch removes the patterned second material stack MS2 of the fin cut structure from each source/drain region.

The second nanosheet stack is composed of remaining portions of the patterned second material stack MS2. That is, the second nanosheet stack is composed of a remaining (i.e., non-etched) portion of each second sacrificial semiconductor material layer 18L and a remaining (i.e., non-etched) portion of each second semiconductor channel material layer 20L. Each remaining (i.e., non-etched) portion of the second sacrificial semiconductor material layers 18L can be referred to herein as a second sacrificial semiconductor material nanosheet 18NS, while each remaining (i.e., non-etched) portion of the second semiconductor channel material layers 20L can be referred to herein as a second semiconductor channel material nanosheet 20NS. The second nanosheet stack has a second width.

Figure 14B:
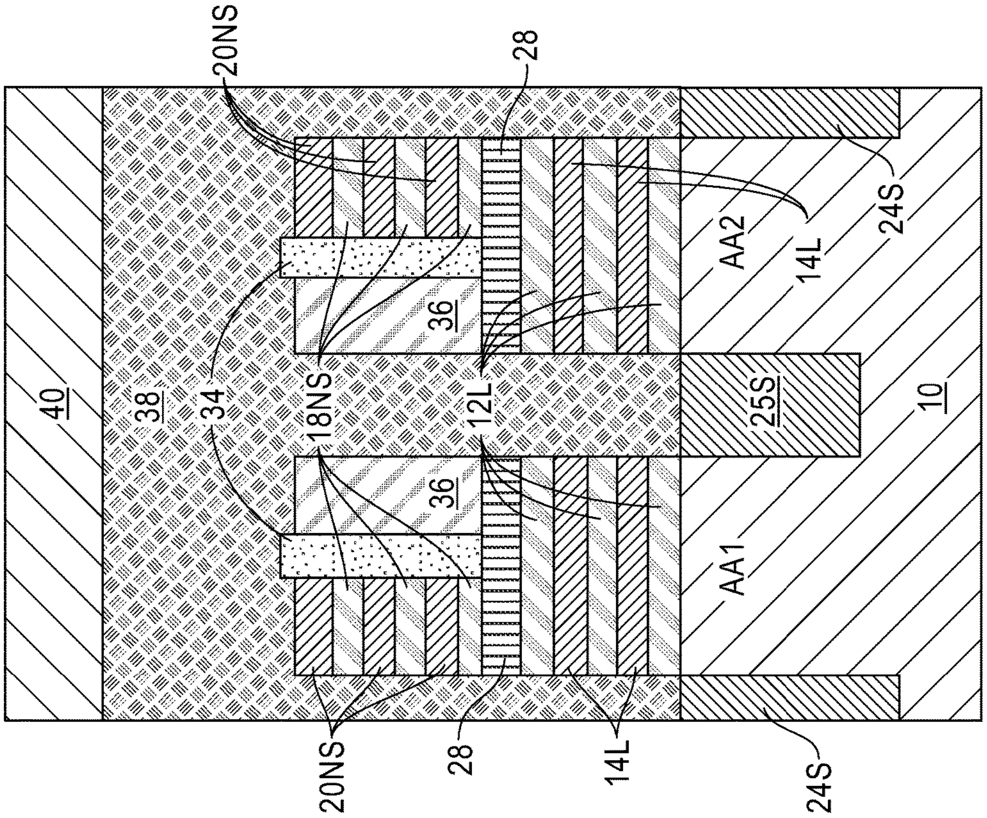
FIGS. 14A-14D are cross-sectional views of the exemplary semiconductor structure shown in FIGS. 13A-13D, respectively, after forming a second nanosheet stack and removing the dielectric pillar from the source/drain region.
Figure 14A:
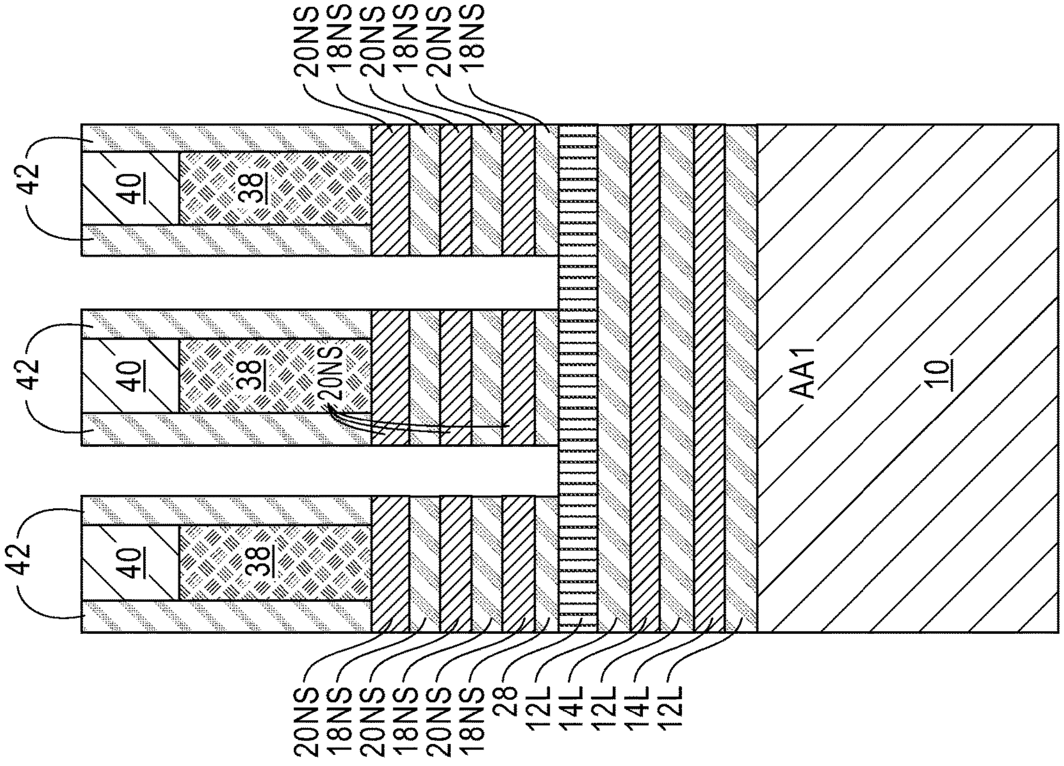
Figure 14D:
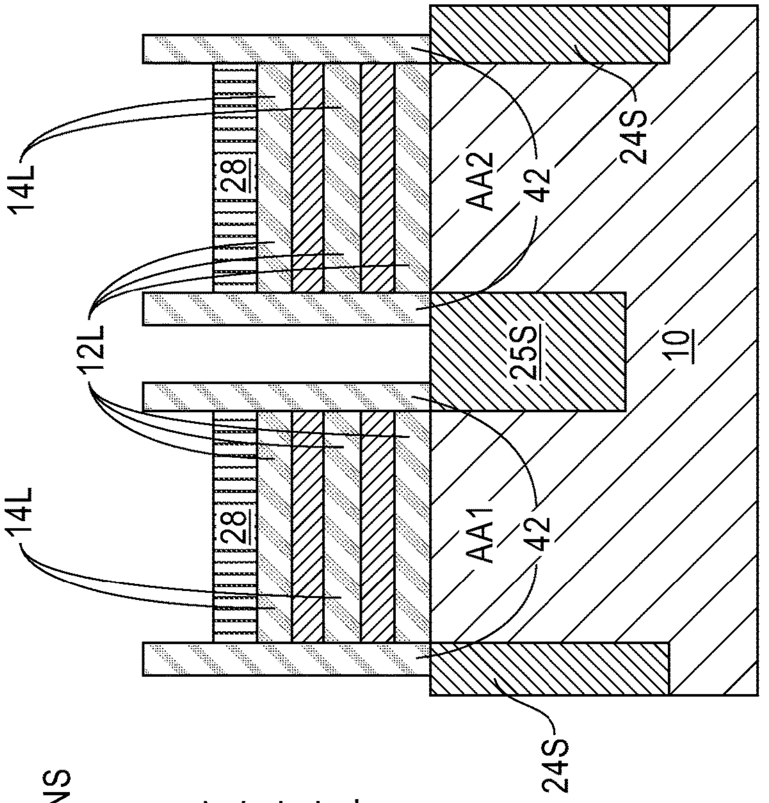
Figure 14C:
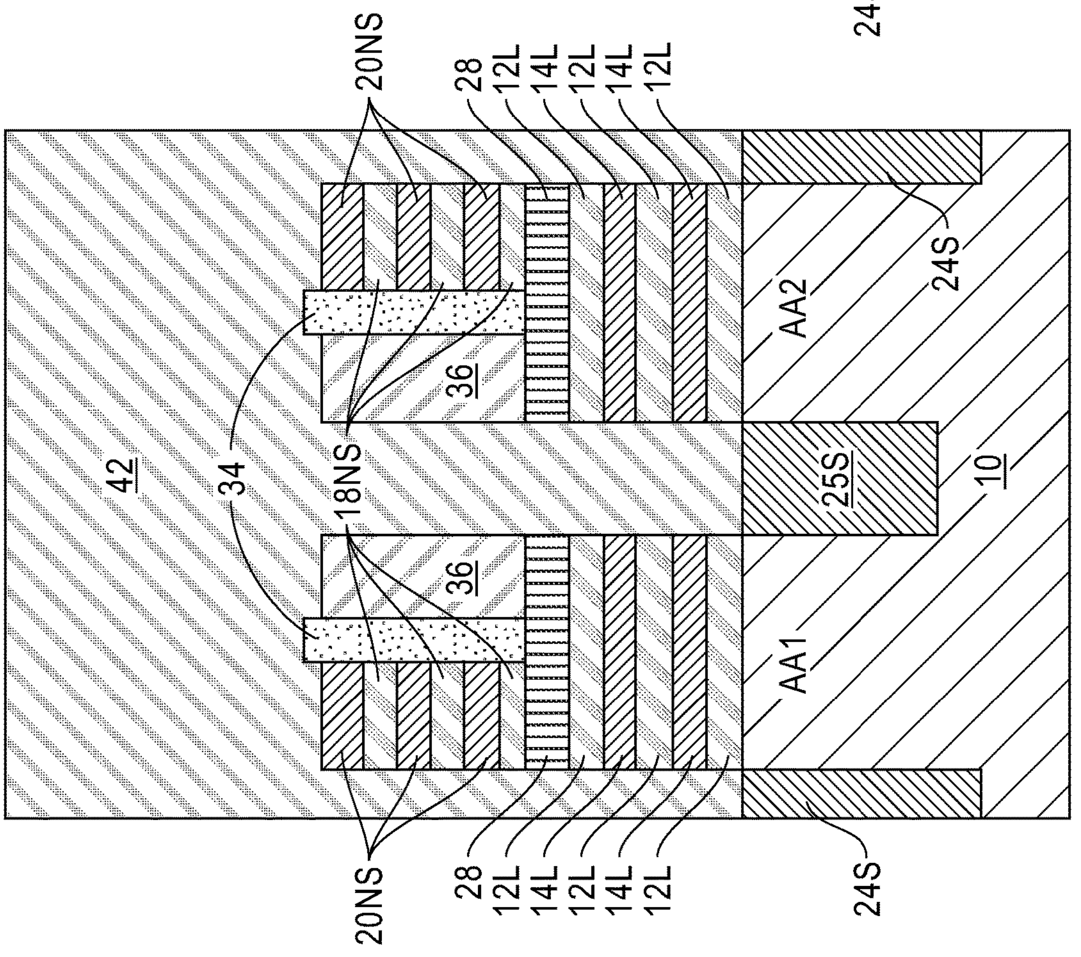

The dielectric pillar 36 can be removed from the source/drain regions utilizing an etch such as, for example, RIE, that is selective in removing the dielectric pillar 36. Note that the dielectric pillar 36 and the sacrificial semiconductor material pillar 34 are only removed from the source/drain region of the structure as shown in FIG. 14D. The dielectric pillar 36 and the sacrificial semiconductor material pillar 34 that are present beneath the sacrificial gate structure 38 and the gate dielectric spacers 42 remain as is shown in FIGS. 14B and 14C, respectively.

Referring now to FIGS. 15A-15D, there are illustrated the exemplary semiconductor structure shown in FIGS. 14A-14D, respectively, after forming a first nanosheet stack beneath the second nanosheet stack. The forming of the second nanosheet stack includes a first etch that punches through the middle dielectric isolation layer 28 that is not protected by the combined etch mask. This first etch is selective in removing the physically exposed portion of the middle dielectric isolation layer 28. This first etch reveals a portion of the patterned first material stack PS1. A second etch is then performed on the revealed portion of the patterned first material stack PS1 to provide the first nanosheet stack.

Figure 15B:
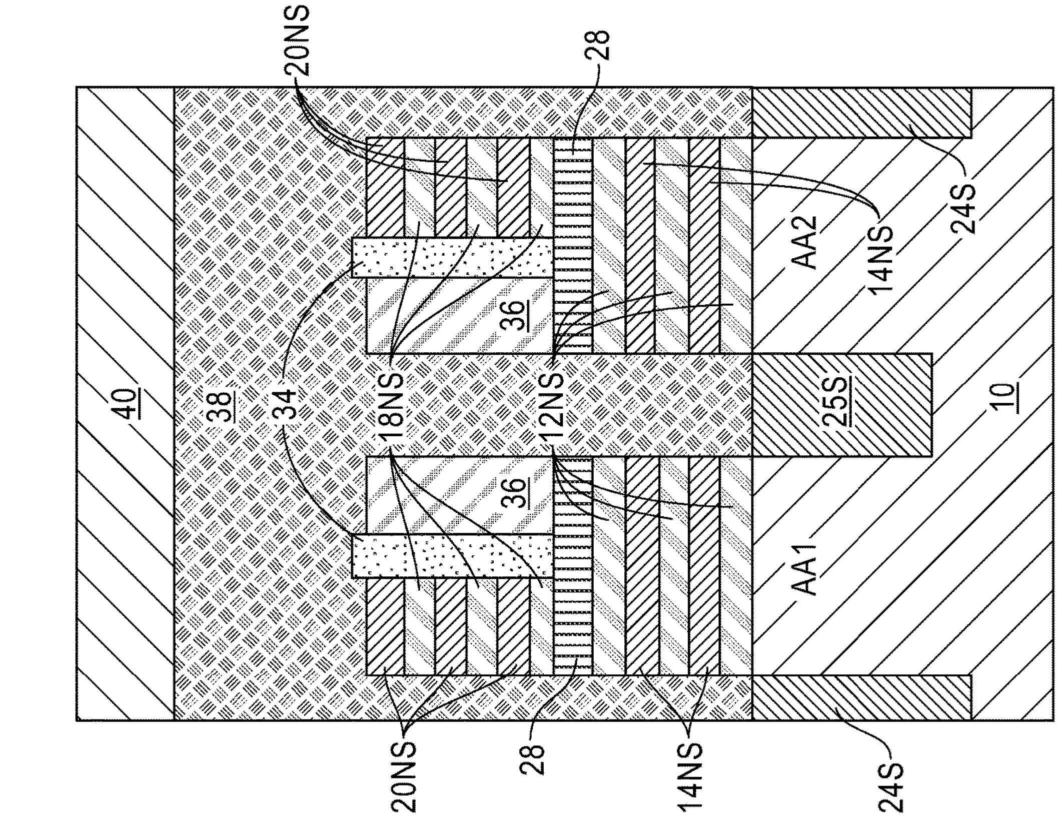
FIGS. 15A-15D are cross-sectional views of the exemplary semiconductor structure shown in FIGS. 14A-14D, respectively, after forming a first nanosheet stack beneath the second nanosheet stack.
Figure 15A:
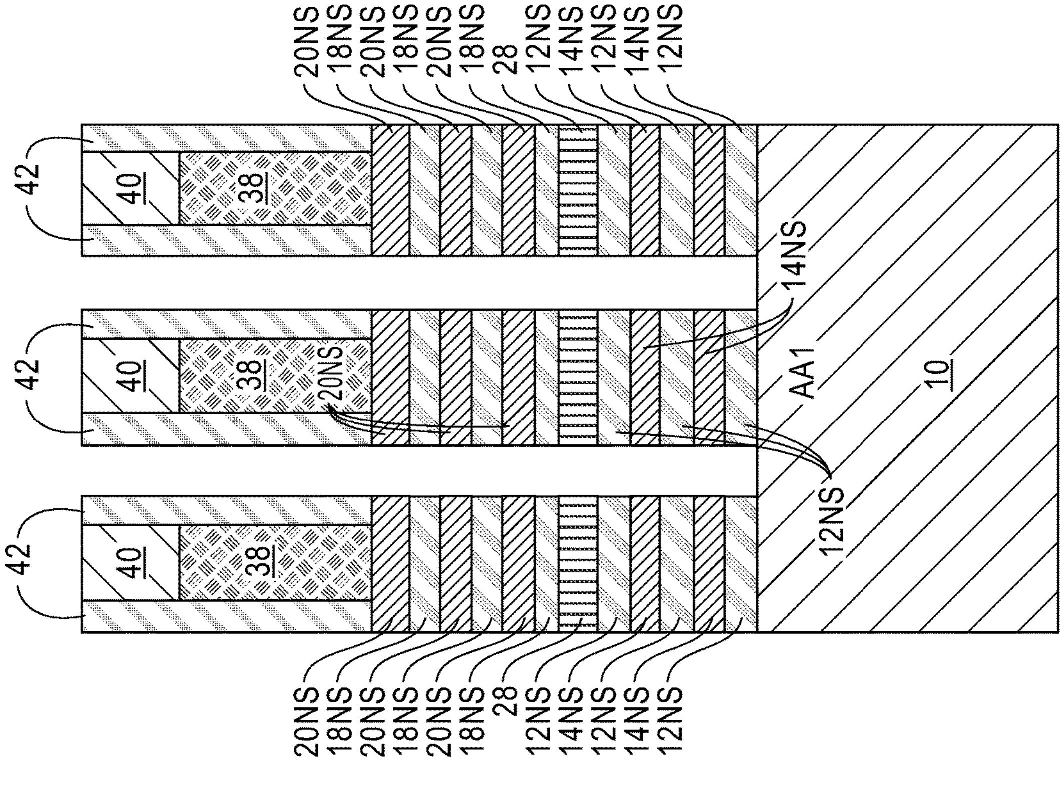
Figure 15C:
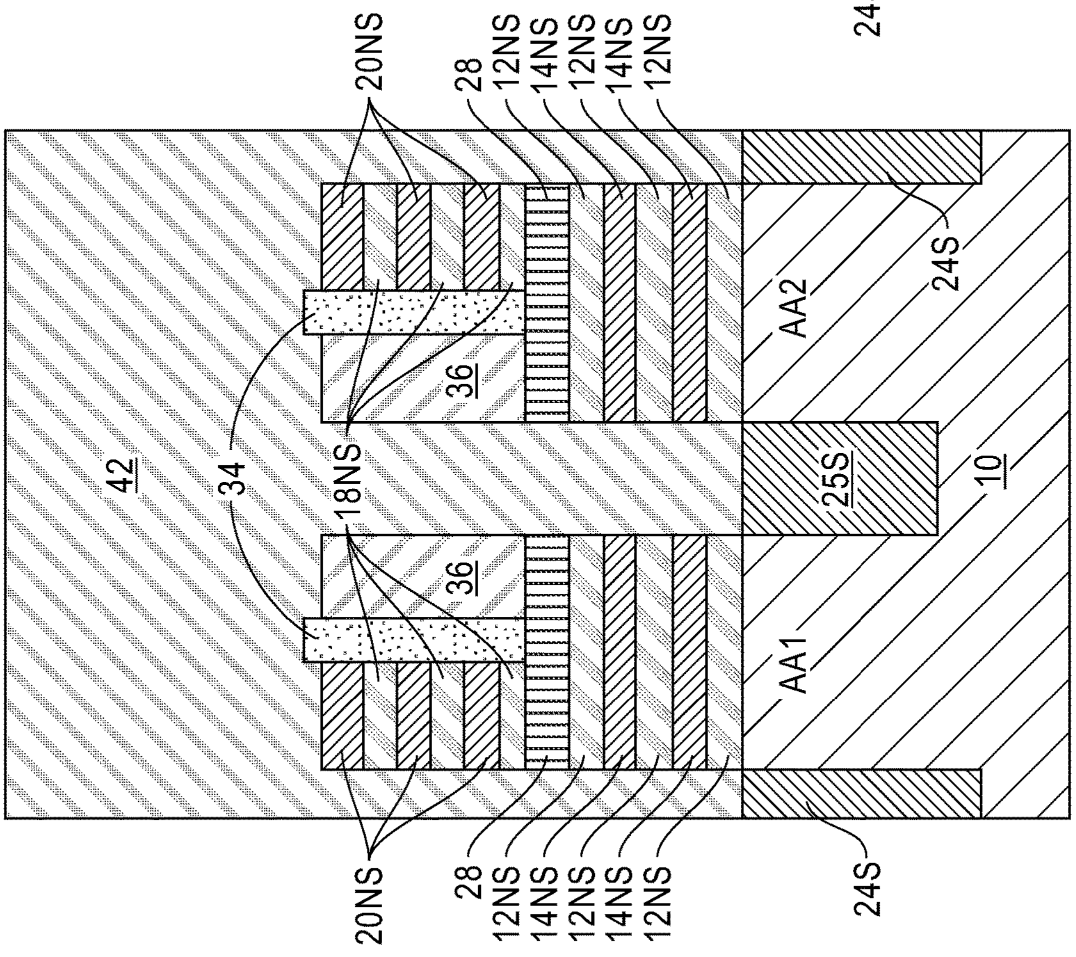

The first nanosheet stack is composed of remaining portions of the patterned first material stack PS1. That is the first nanosheet stack is composed of a remaining (i.e., non-etched) portion of each first sacrificial semiconductor material layer 12L and a remaining (i.e., non-etched) portion of each first semiconductor channel material layer 14L. Each remaining (i.e., non-etched) portion of the first sacrificial semiconductor material layers 12L can be referred to herein as a first sacrificial semiconductor material nanosheet 12NS, while each remaining (i.e., non-etched) portion of the first semiconductor channel material layers 14L can be referred to herein as a first semiconductor channel material nanosheet 14NS. The first nanosheet stack has a first width that is greater than the second width of the second nanosheet stack. This is illustrated in FIGS. 15B and 15C of the present application. In the present application, the first width is equal to the second width plus the width of the sacrificial semiconductor material pillar 34 plus the width of the dielectric pillar 36.

Figure 15D:
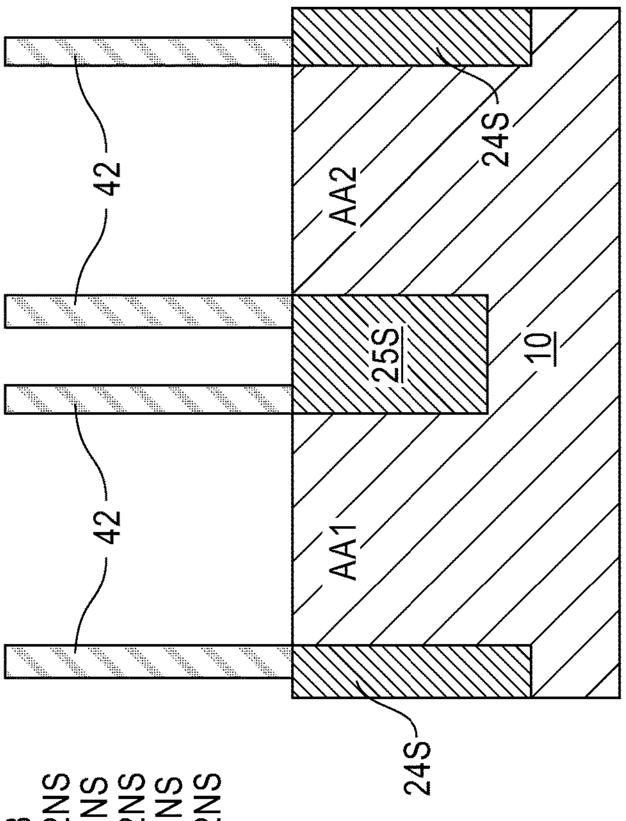
Figure 16B:
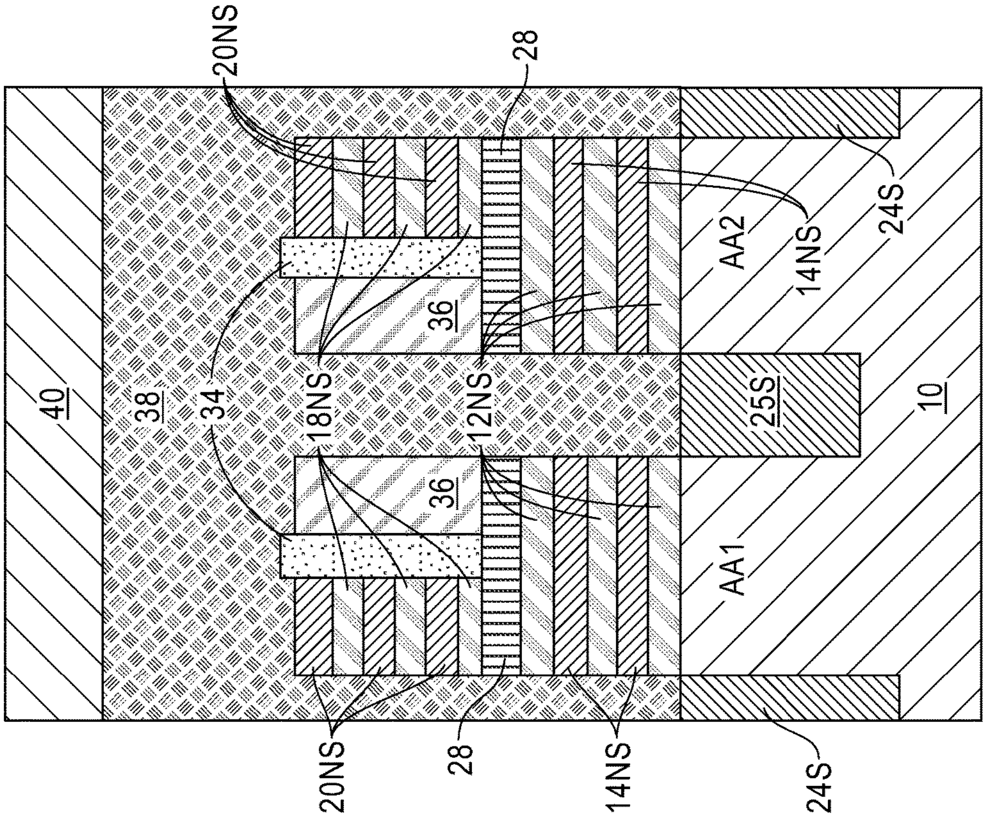
FIGS. 16A-16D are cross-sectional views of the exemplary semiconductor structure shown in FIGS. 15A-15D, respectively, after recessing each second sacrificial semiconductor material nanosheet of the second nanosheet stack and each first sacrificial semiconductor material nanosheet of the first nanosheet stack and forming a fork shaped inner spacer in the region including the second nanosheet stack, and a horizontal inner spacer in the region including the first nanosheet stack.
Figure 16A:
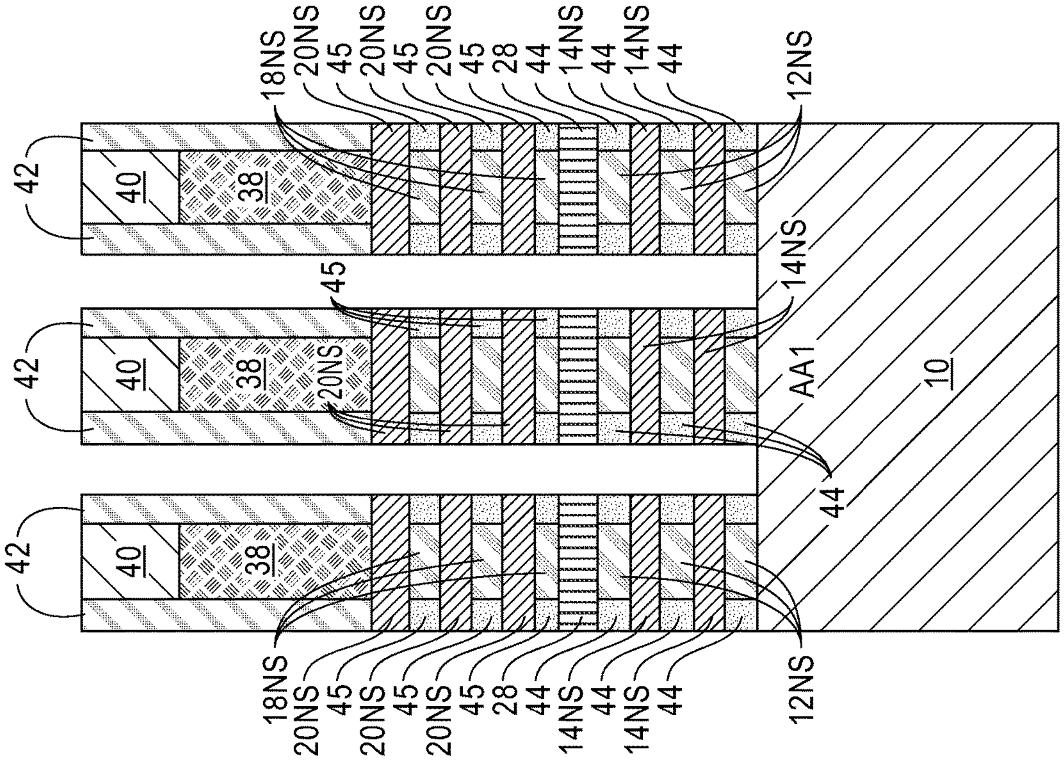
Figure 16C:
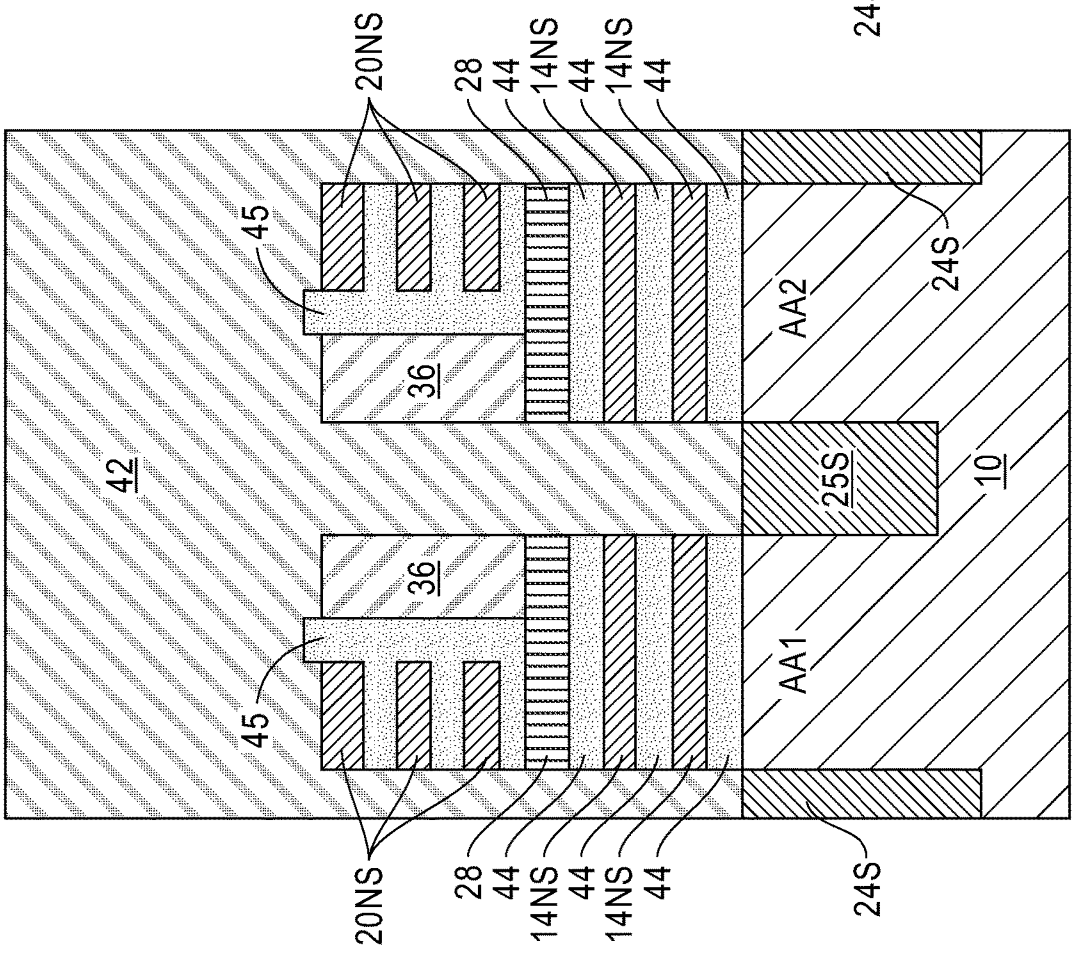
Figure 16D:
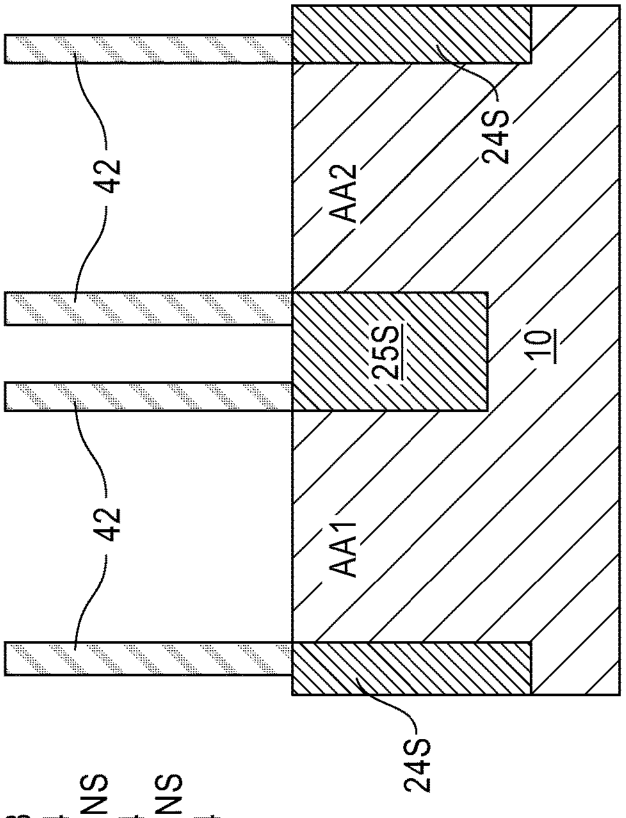
Figure 17A:
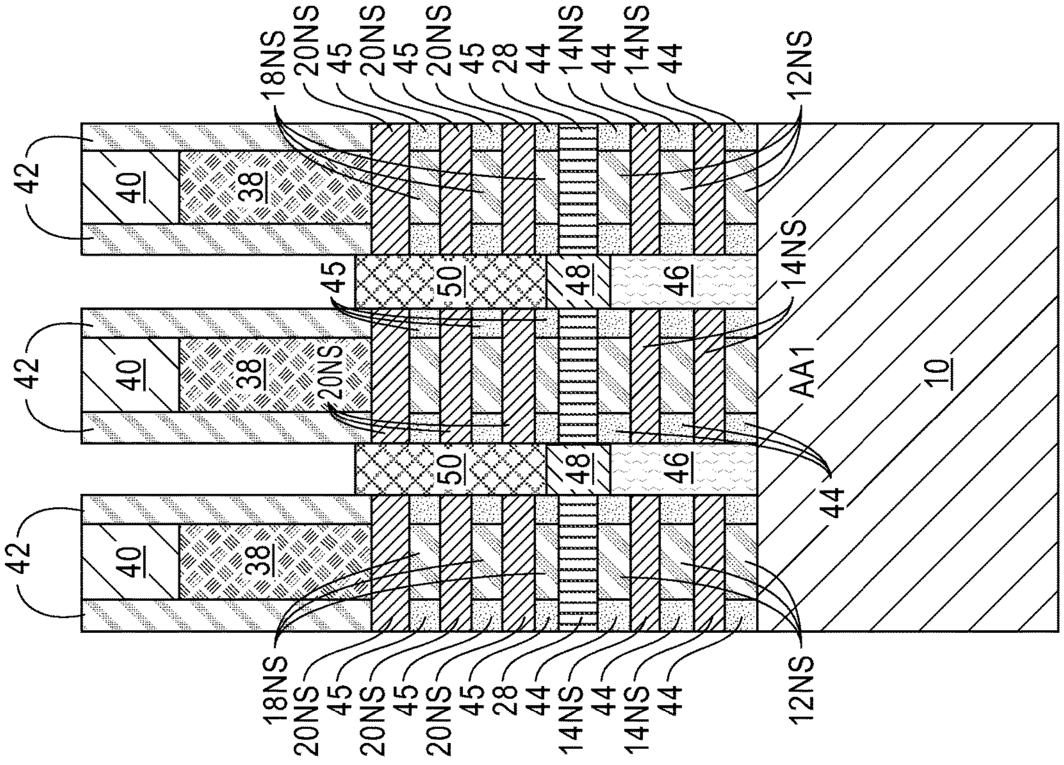
FIGS. 17A-17D are cross-sectional views of the exemplary semiconductor structure shown in FIGS. 16A-16D, respectively, after forming first source drain regions in the region including the first nanosheet stack, and second source/drain regions in the region including the second nanosheet stack, wherein the first source/drain regions are vertically spaced apart from the second source/drain regions by a third ILD layer.
Figure 17B:
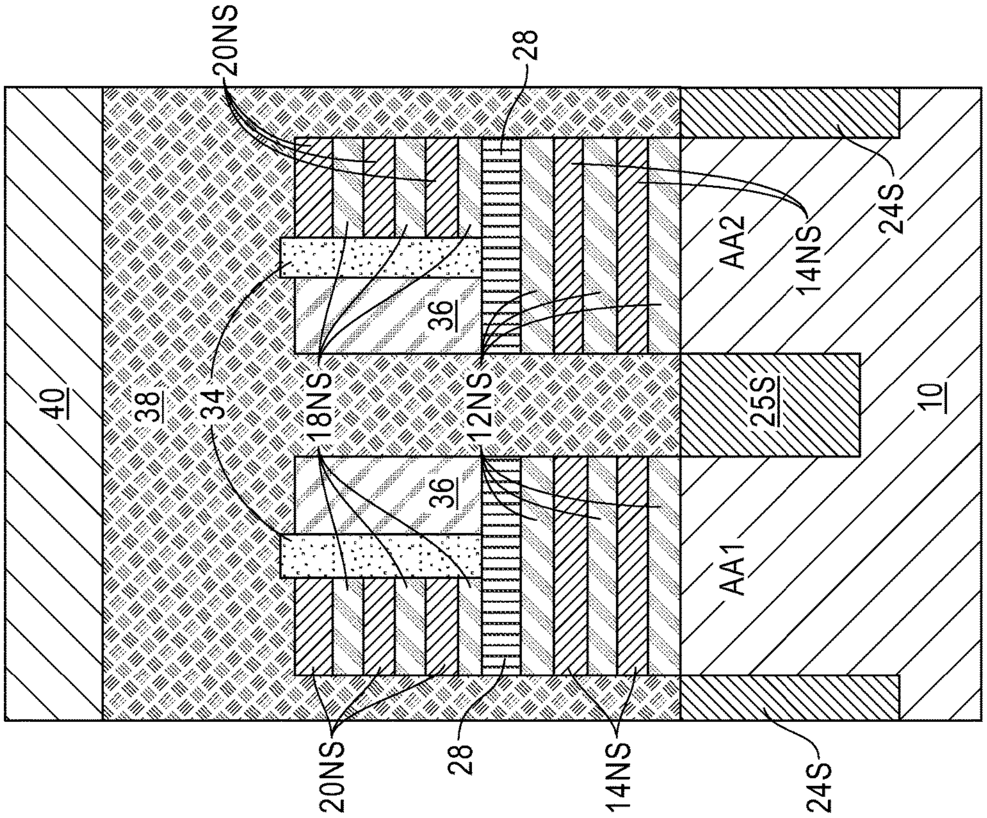
Figure 17C:
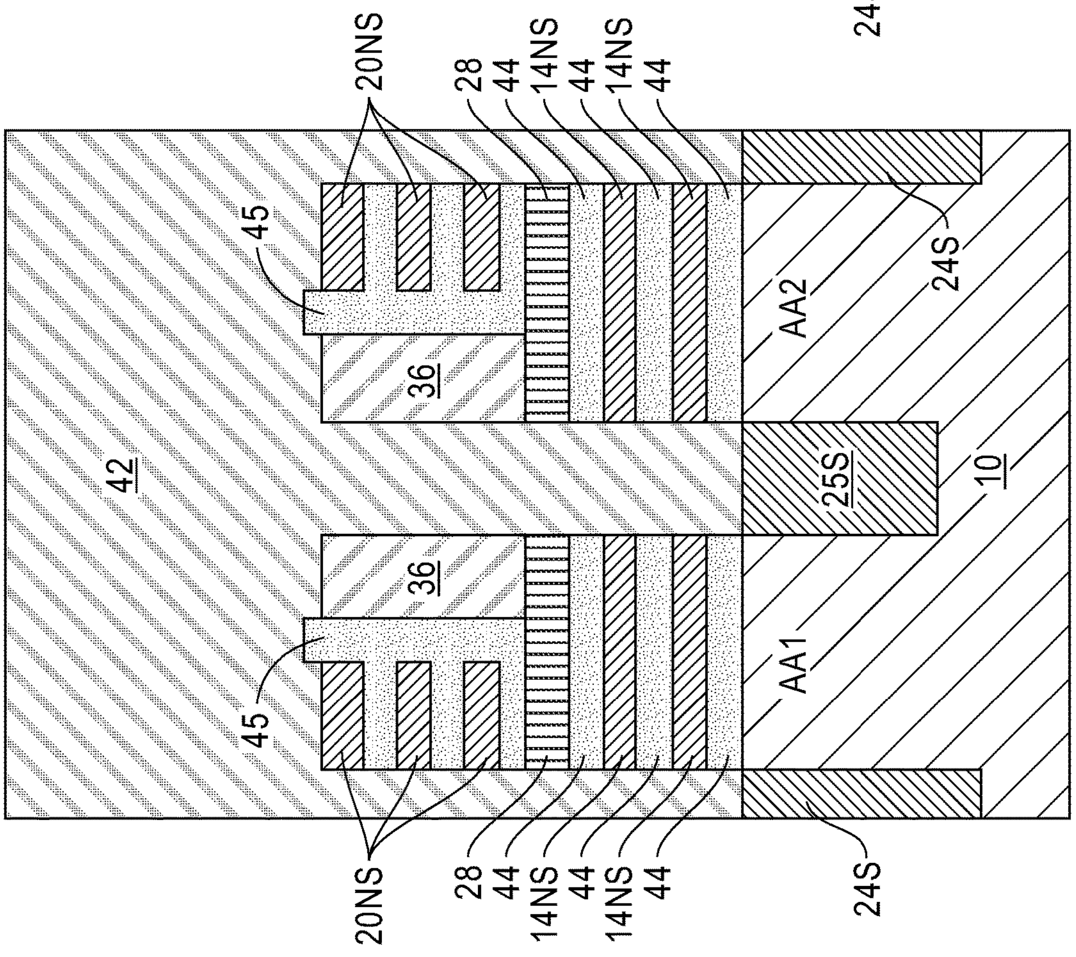
Figure 17D:
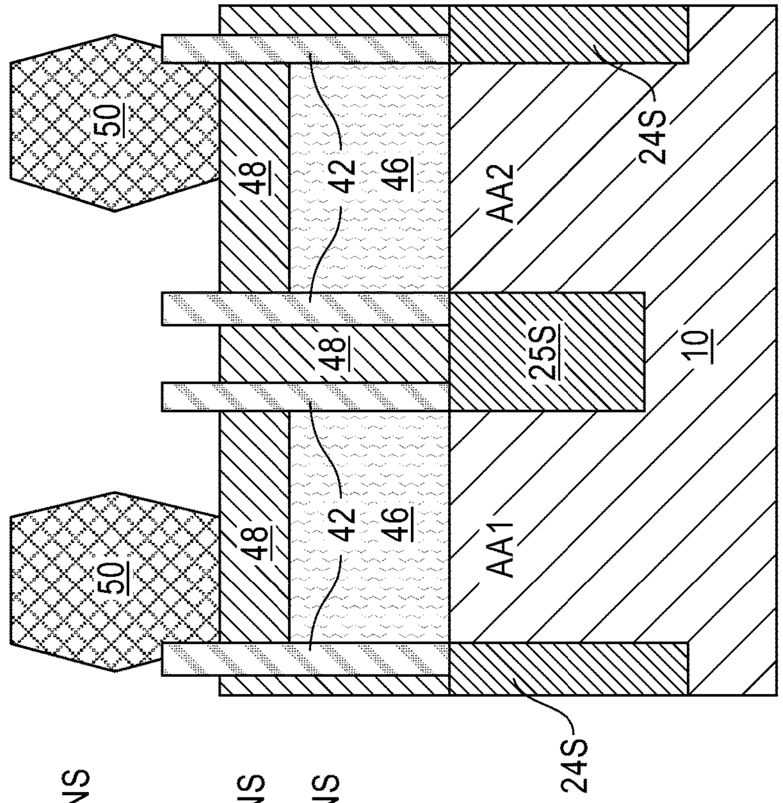
Figure 18B:
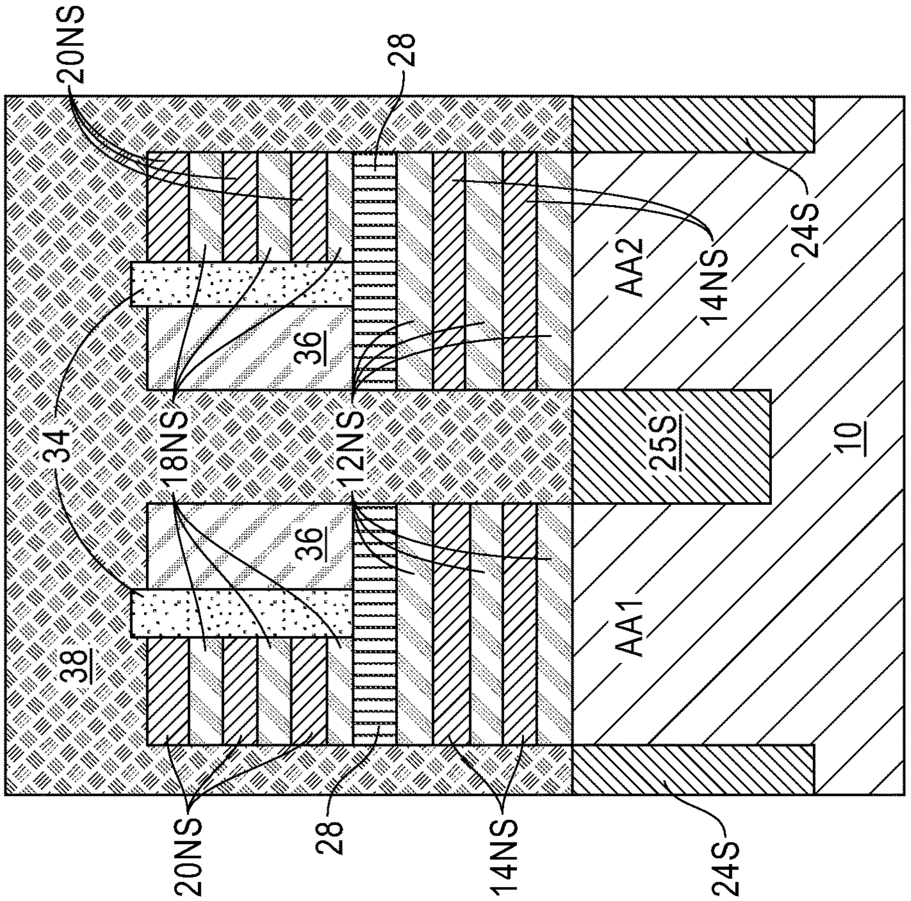
FIGS. 18A-18D are cross-sectional views of the exemplary semiconductor structure shown in FIGS. 17A-17D, respectively, after cutting the second source/drain regions, and forming a fourth ILD layer.
Figure 18A:
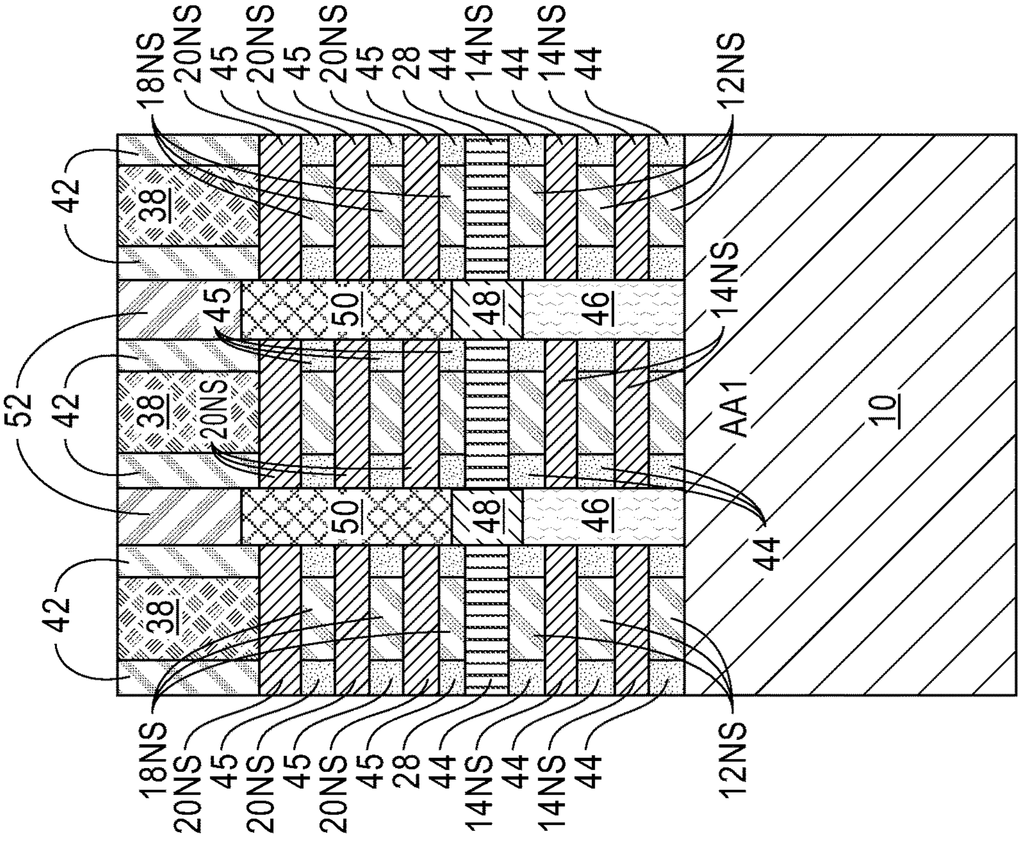
Figure 18D:
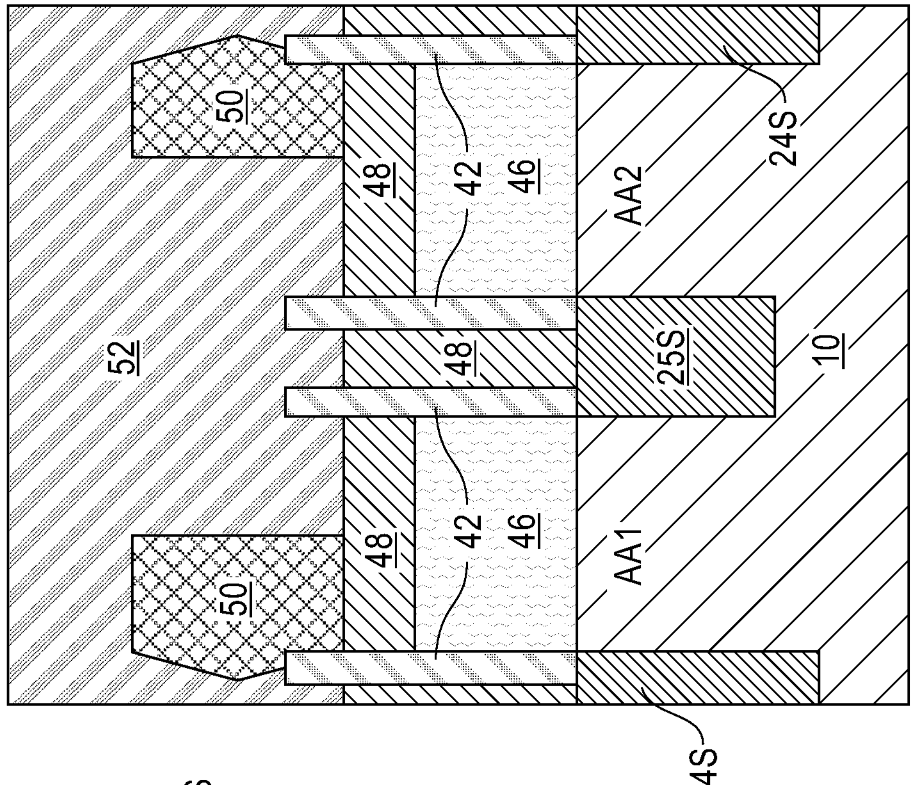
Figure 18C:
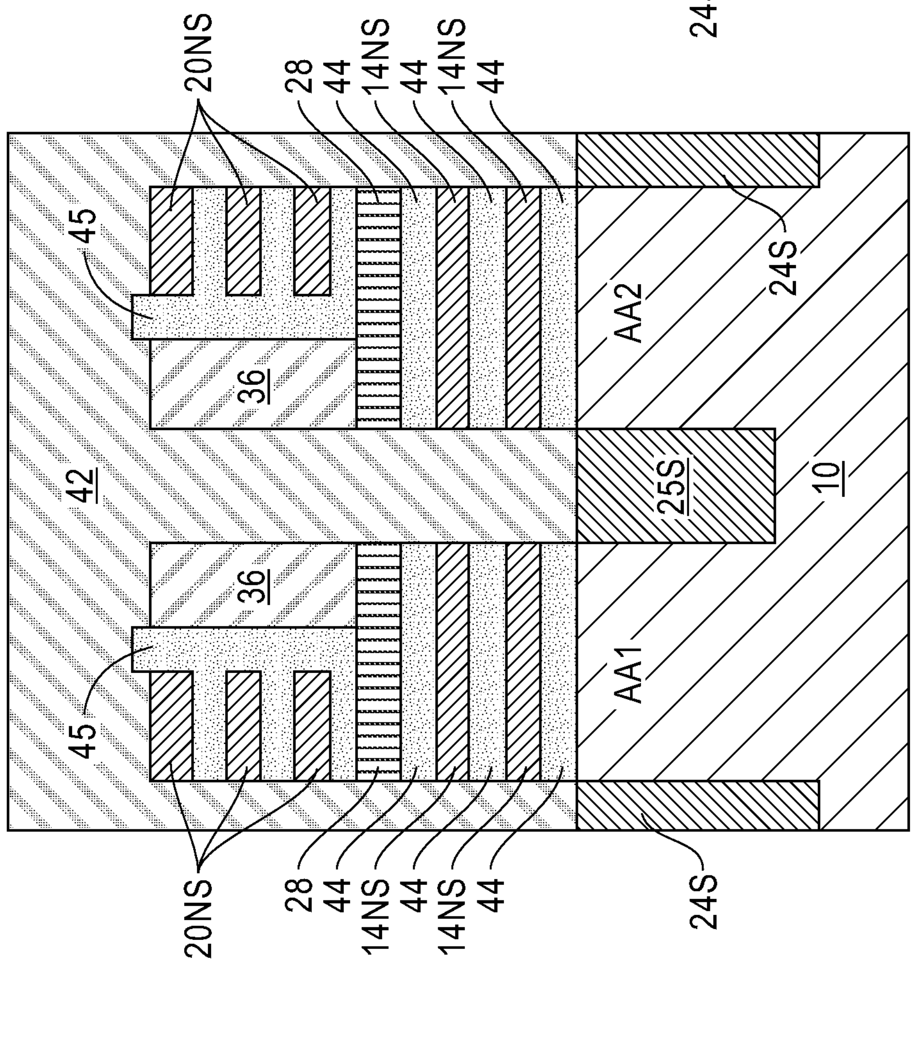
Figure 19B:
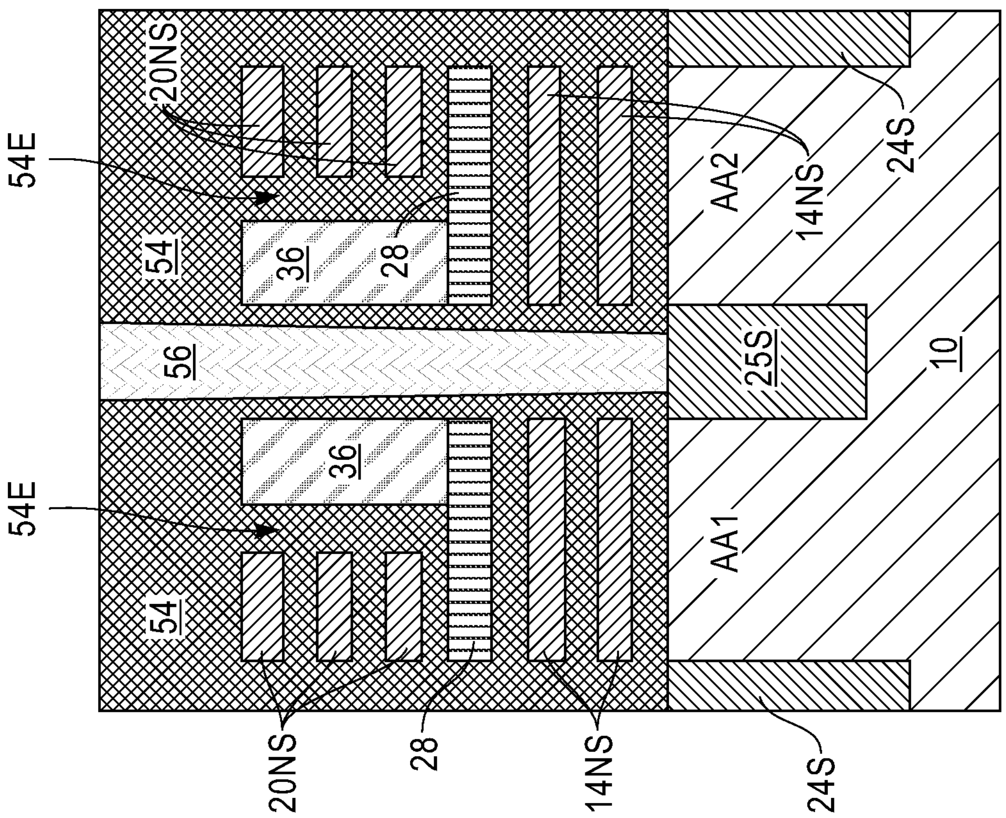
FIGS. 19A-19D are cross-sectional views of the exemplary semiconductor structure shown in FIGS. 18A-18D, respectively, after removing the at least one sacrificial gate structure, removing each second sacrificial semiconductor material nanosheet from the second nanosheet stack and each first sacrificial semiconductor material nanosheet from the first nanosheet stack, forming a gate structure that wraps around a portion of each second semiconductor channel material nanosheet of the second nanosheet stack and around a portion of each first semiconductor channel material nanosheet of the first nanosheet stack, cutting the gate structure and forming a gate cut dielectric pillar.
Figure 19A:
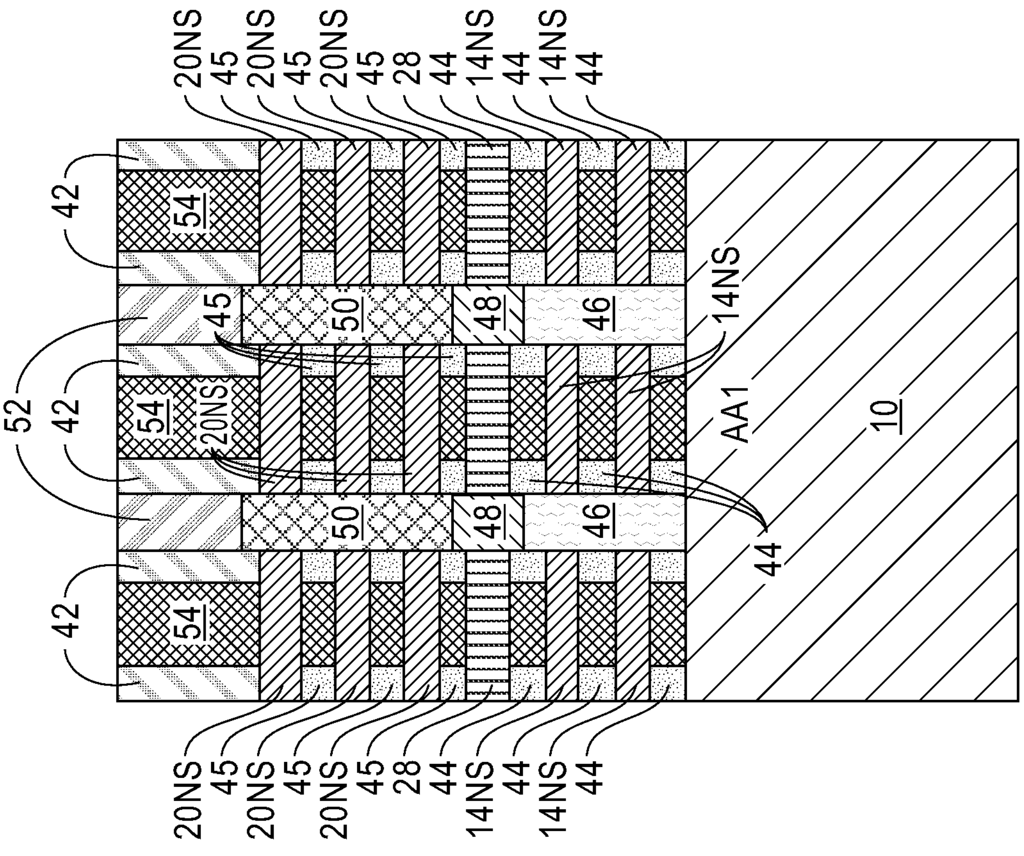
Figure 19C:
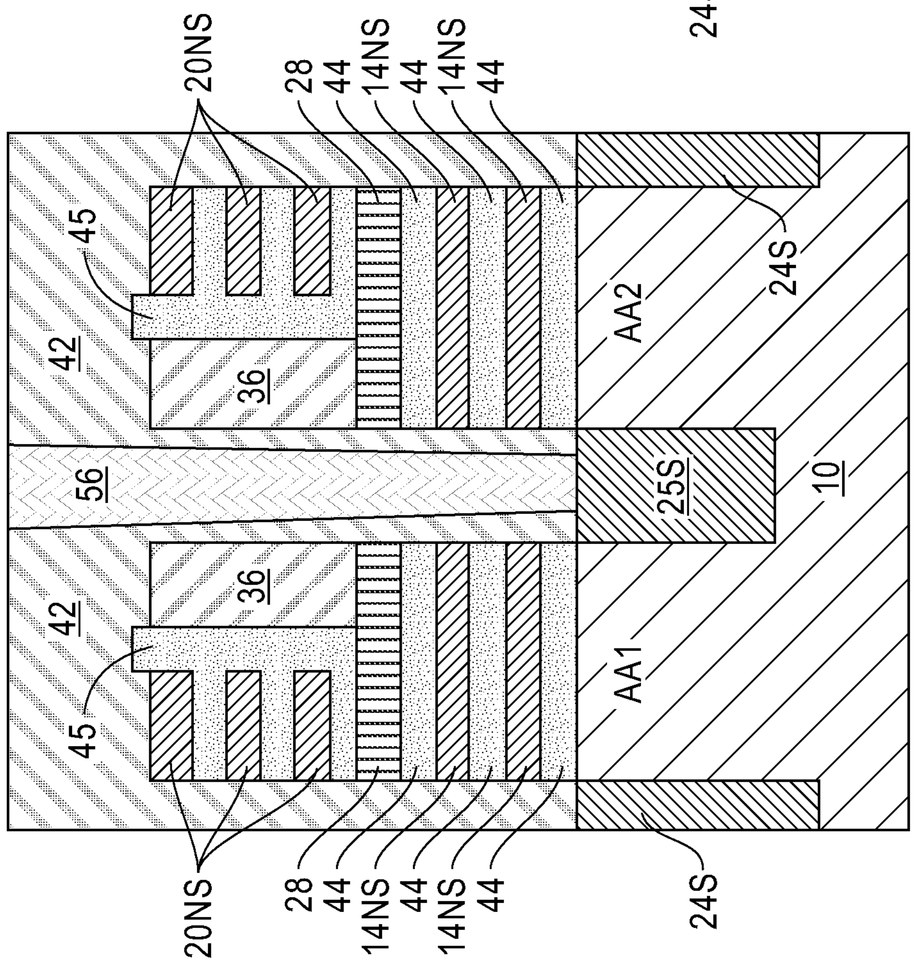
Figure 19D:
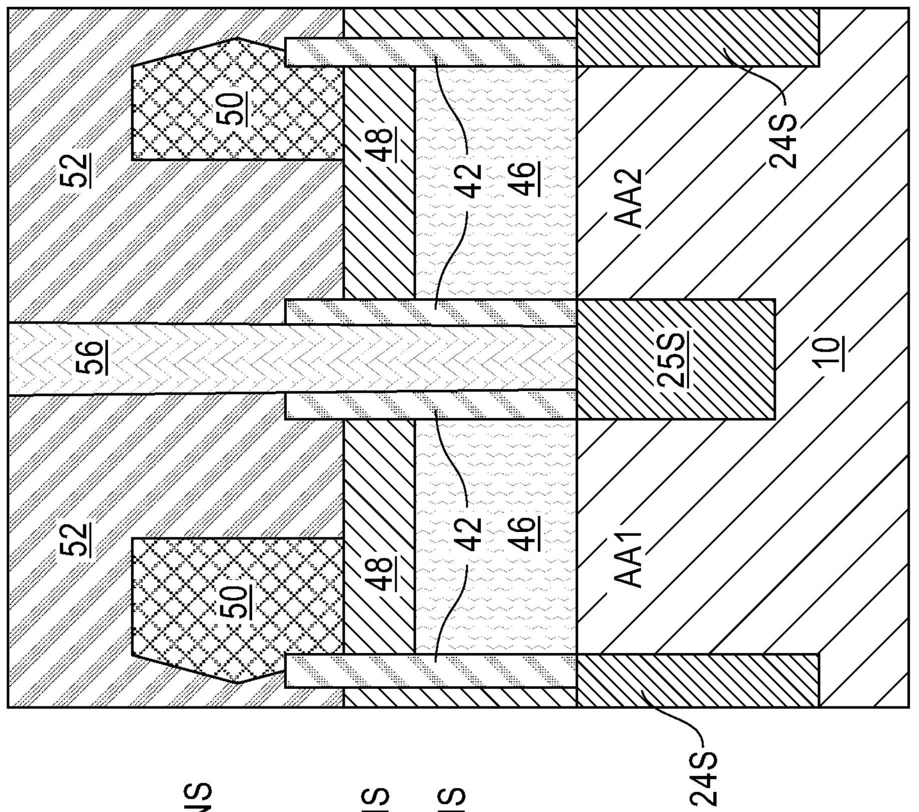

Note that within the source/drain regions, the middle dielectric isolation layer 28 etch, and the patterned first material stack PS1 etch entirely remove the middle dielectric isolation layer 28 and the patterned first material stack PS1 from the source/drain regions. Thus, a topmost surface of each mesa portion within the source/drain regions is physically exposed as is shown in FIG. 15D.

Referring now to FIGS. 16A-16D, there are illustrated the exemplary semiconductor structure shown in FIGS. 15A-15D, respectively, after recessing each second sacrificial semiconductor material nanosheet 18NS of the second nanosheet stack and each first sacrificial semiconductor material nanosheet 12NS of the first nanosheet stack and forming a fork shaped inner spacer 45 in the region including the second nanosheet stack, and a horizontal inner spacer 44 (notably, a plurality of horizontal inner spacers are formed in the region including the first nanosheet stack). It is noted that during the recessing of the second sacrificial semiconductor material nanosheets 18NS and the first sacrificial semiconductor material nanosheets 12NS, the sacrificial semiconductor material pillar 34 that is located beneath the gate dielectric spacer 42 is also removed (See, for example, FIG. 16C) since the second semiconductor material nanosheets 18NS, the first sacrificial semiconductor material nanosheets 12NS, and the sacrificial semiconductor material pillar 34 are each composed of a same semiconductor material (i.e., the first semiconductor material mentioned above).

The recessing step includes a lateral etch that is selective in removing the first semiconductor material that provides each of the second semiconductor material nanosheets 18NS, the first sacrificial semiconductor material nanosheets 12NS, and the sacrificial semiconductor material pillar 34. A horizontal gap is formed adjacent to each recessed first and second sacrificial semiconductor material nanosheets 12NS, 18NS. Also, and with the region including the second nanosheet stack, the removal of the sacrificial semiconductor material pillar 34 forms a vertical gap that is connected to each horizontal gap that is adjacent to each second semiconductor material nanosheets 18NS.

The horizontal gaps in the region including the first nanosheet stack and the combined horizontal gaps and vertical gap in the region including the second nanosheet stack are then filled with an inner dielectric spacer material. The inner dielectric spacer material can be compositionally the same as, or compositionally different from, the gate dielectric spacer material that provides the gate dielectric spacers 42. The inner dielectric spacer material includes, but is not limited to, silicon dioxide, SiN, SiBCN, SiOCN or SiOC. In the region including the first nanosheet stack, horizontal inner spacers 44 are formed. The horizontal inner spacers 44 are not connected to each other. The horizontal inner spacers 44 are formed above and below each of the first semiconductor channel material nanosheets 14NS. The horizontal spacers 44 have an outermost sidewall that is vertically aligned to an outermost sidewall of each first semiconductor channel material nanosheet 14NS. In the region including the second nanosheet stack, fork shaped inner spacer 45 is formed. The term "fork shaped inner spacer" defines an inner spacer that has a plurality of horizontal (i.e., prong) portions that are directly connected to a vertical (i.e., base) portion that extends along the sidewall of each second semiconductor channel material nanosheet 20NS, See, for example, FIG. 16C. The vertical portion of the fork shaped inner spacer 45 also contacts a sidewall of the dielectric pillar 36, See, for example, FIG. 16C.

Referring now to FIGS. 17A-17D, there are illustrated the exemplary semiconductor structure shown in FIGS. 16A-16D, respectively, after forming first source drain regions 46 in the region including the first nanosheet stack, and second source/drain regions 50 in the region including the second nanosheet stack, wherein the first source/drain regions 46 are vertically spaced apart from the second source/drain regions 50 by a third ILD layer 48.

The first (or bottom) source/drain regions 46 extend outward from a sidewall of each first semiconductor channel material nanosheet 14NS and are present on a surface of the mesa portion of the semiconductor substrate 10. Each of the first source/drain regions 46 is composed of a fifth semiconductor material and a first dopant. As used herein, a "source/drain" region can be a source region or a drain region depending on subsequent wiring and application of voltages during operation of the transistor. The fifth semiconductor material can be compositionally the same, or compositionally different from, the second semiconductor material that provides each first semiconductor channel material nanosheet 14NS. The first dopant that is present in the first source/drain regions 46 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each first source/drain region 46 can have a dopant concentration of from $4\times10^{20}$ atoms/$cm^3$ to $3\times10^{21}$ atoms/$cm^3$. The first source/drain regions 46 are typically formed by an epitaxial growth process, as defined above. A recess etch can follow the epitaxial growth process.

The third ILD layer 48 includes one of the dielectric materials mentioned above for the first ILD layer 24. The third ILD layer 48 can be formed utilizing a deposition process as mentioned above in forming the first ILD layer 24. A recess etch can follow the deposition of the dielectric material that provides the third ILD layer 48.

The second (or top) source/drain regions 50 extend outward from a sidewall of each second semiconductor channel material nanosheet 20NS and are present on a surface of third ILD layer 28. Each of the second source/drain regions 50 is composed of a sixth semiconductor material and a second dopant. The sixth semiconductor material can be compositionally the same, or compositionally different from, the third semiconductor material that provides each second semiconductor channel material nanosheet 20NS. The second dopant that is present in the second source/drain regions 50 can be either a p-type dopant or an n-type dopant. The second dopant can be of a same, or different, conductivity type as the first dopant. In one example, each source source/drain region 50 can have a dopant concentration of from $4\times10^{20}$ atoms/$cm^3$ to $3\times10^{21}$ atoms/$cm^3$. The second source/drain regions 50 are typically formed by an epitaxial growth process, as defined above. A recess etch can follow the epitaxial growth process.

Referring now to FIGS. 18A-18D, there are illustrated the exemplary semiconductor structure shown in FIGS. 17A-17D, respectively, after cutting the second source/drain regions 50, and forming a fourth ILD layer 52. In some embodiments, the cutting of the second source/drain regions 50 can be omitted. The cutting step will allow sufficient space for the formation of a contact structure that contacts the first source/drain regions 46. Cutting of the second source/drain regions 50 can include lithography and etching. Prior to cutting, the second source/drain regions 50 are diamond shaped (i.e., they have faceted sidewalls). After cutting, the second source/drain regions are non-diamond shaped (i.e., they have a least one sidewall that is substantially perpendicular to a horizontal surface of the semiconductor substrate 10; another sidewall of the non-diamond shaped source/drain regions can be faceted.

The fourth ILD layer 52 includes one of the dielectric materials mentioned above for the first ILD layer 24. The fourth ILD layer 52 can be formed utilizing a deposition process as mentioned above in forming the first ILD layer 24. A planarization process follows the deposition of the dielectric material that provides the fourth ILD layer 48. The planarization process removes the sacrificial gate cap 40 and an upper portion of each gate dielectric spacer 42 and reveals the sacrificial gate structure 38.

Referring now to FIGS. 19A-19D, there are illustrated the exemplary semiconductor structure shown in FIGS. 18A-18D, respectively, after removing the at least one sacrificial gate structure 38, removing each second sacrificial semiconductor material nanosheet 18NS from the second nanosheet stack and each first sacrificial semiconductor material nanosheet 12NS from the first nanosheet stack, forming a gate structure 54 that wraps around a portion of each second semiconductor channel material nanosheet 20NS of the second nanosheet stack and around a portion of each first semiconductor channel material nanosheet 14NS of the first nanosheet stack, cutting the gate structure 54 and forming a gate cut dielectric pillar 56.

The sacrificial gate structure 38 can be removed utilizing a material removal process such as, for example, etching, that is selective in removing the sacrificial gate structure 38. This material removal steps revels the underlying second nanosheet stack. After revealing the second nanosheet stack, each second sacrificial semiconductor material nanosheet 18NS and each first sacrificial semiconductor nanosheet 12NS are removed. This step suspends a portion of each second semiconductor channel material nanosheet 20NS and each first semiconductor channel material nanosheet 14NS. Each first and second sacrificial semiconductor material nanosheet is removed utilizing any material removal process such as, for example, etching, which is selective in removing the first and second sacrificial semiconductor material nanosheets. This etch also removes the sacrificial semiconductor material pillar 34 that was previously present under the sacrificial gate structure 38.

The gate structure 54 is formed in the area previously accompanied by the first and second sacrificial semiconductor material nanosheets and the sacrificial semiconductor material pillar 34 that was previously present under the sacrificial gate structure 38. The gate structure 54 is also formed on top of the topmost second semiconductor channel material nanosheet 20NS. The gate structure 54 wraps around the suspended portion of each second semiconductor channel material nanosheets 20Ns and around the suspended portion of each first semiconductor channel material nanosheet 14NS. The gate structure 54 includes a gate dielectric layer and a gate electrode; both the gate dielectric layer and the gate electrode are not separately shown in the drawing, but both are included in the area shown as the gate structure 54. As is known, the gate dielectric layer is formed directly around the suspended portion of each first and second semiconductor channel material nanosheets and the gate electrode is formed on the gate dielectric layer. Thus, the gate structure 54 is a common (or shared) gate structure. The gate dielectric layer of the gate structure 54 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb)O). The gate dielectric material can further include dopants such as lanthanum (La), aluminum (Al) and/or magnesium (Mg).

The gate electrode of the gate structure 54 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 54 can be formed by deposition of the gate dielectric material and the gate electrode material, followed by a planarization process which removes any gate dielectric material and gate electrode material that is formed atop the gate dielectric spacers 42 and the fourth ILD layer 52.

The gate structure 54 of the second FET device includes a gate extension 54E that is self-aligned and is present between a sidewall of each second semiconductor channel material nanosheet 20NS and the dielectric pillar 26. The self-aligned gate extension 54E minimizes capacitance of the second FET device of the stacked FET structure.

The gate cut dielectric pillar 56 is composed of a dielectric material including one of the dielectric materials mentioned above for the dielectric pillar 36. The gate cut dielectric pillar 56 can be formed by a gate cut process that includes lithography and etching to form a gate cut region, and then filling (by deposition and planarization) the gate cut region with a dielectric material. The gate cut dielectric pillar 56 has topmost surface that is substantially coplanar with a topmost surface of the gate electrode 54. The gate cut dielectric pillar 56 lands on a surface of the second shallow trench isolation region 25S as is shown for example, in FIGS. 19B-19D.

Referring now to FIGS. 20A-20D, there are illustrated the exemplary semiconductor structure shown in FIGS. 19A-19D, respectively, after forming a fifth ILD layer, wherein the fifth ILD layer and the fourth ILD layer 52 collectively provide a MOL dielectric layer 53, and forming contact structures including second source/drain contact structures 58A, first source/drain contact structures 58B, and gate contact structures 58C.

The fourth ILD layer includes one of the dielectric materials mentioned above for the first ILD layer 24. The dielectric material that provides the fourth ILD layer can be compositionally the same as, or compositionally different from, the dielectric material that provides the third ILD layer 52. The fourth ILD layer is formed on top of each of the gate dielectric spacer 42, the gate structure 54 and the third ILD layer 52. The fourth ILD layer can be formed utilizing one of the deposition processes mentioned above in forming the first ILD layer 24.

The contact structures including the second source/drain contact structures 58A, the first source/drain contact structure 58B, and the gate contact structures 58C are then formed into the MOL dielectric layer 53 utilizing a metallization process which includes contact opening formation and filling the contact openings with at least a contact conductor material. The contact conductor material that can be used for providing the contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. A planarization process follows the filling of the contact openings.

Each second source/drain contact structure 58A is formed in direct physically contact with one of the second source/drain regions 50. Each first source/drain contact structure 58B is formed in direct physically contact with one of the first source/drain regions 46. Each gate contact structure 58C in in direct physically contact with the gate electrode of the gate electrode 54.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a second field effect transistor (FET) stacked above a first FET, wherein the first FET is a first nanosheet FET comprising a plurality of vertically stacked and spaced apart first semiconductor channel material nanosheets, and the second FET is a second nanosheet FET comprising a plurality of vertically stacked and spaced apart second semiconductor channel material nanosheets and each first semiconductor channel material nanosheet of the plurality of vertically stacked and spaced apart first semiconductor channel material nanosheets has a first width, and each second semiconductor channel material nanosheet of the plurality of vertically stacked and spaced apart second semiconductor channel material nanosheets has a second width, wherein the first width is greater than the second width;

a horizontal inner spacer located in a spacer region of the first FET;

a fork shaped inner spacer located in a spacer region of the second FET;

a middle dielectric isolation layer separating the first FET from the second FET and separating the horizontal inner spacer from the fork shaped inner spacer, wherein the fork shaped inner spacer has a bottommost surface in direct physical contact with a topmost surface of the middle dielectric isolation layer; and a dielectric pillar located laterally adjacent to the fork shaped inner spacer and located on the topmost surface of the middle dielectric isolation layer, wherein a third width as measured from an outermost sidewall of each second semiconductor channel material nanosheet of the plurality of vertically stacked and spaced apart second semiconductor channel material nanosheets to an outermost sidewall of the dielectric pillar is substantially equal to the first width, and wherein the outermost sidewall of each second semiconductor channel material nanosheet of the plurality of vertically stacked and spaced apart second semiconductor channel material nanosheets and the outermost sidewall of the dielectric pillar face away from each other.

2. The semiconductor structure of claim 1, wherein the first FET and the second FET comprise a common gate structure, and the dielectric pillar is located laterally adjacent to a gate extension of the second FET.

3. The semiconductor structure of claim 2, further comprising a gate contact structure contacting a gate electrode of the common gate structure.

4. The semiconductor structure of claim 1, wherein each first semiconductor channel material nanosheet of the plurality of vertically stacked and spaced apart first semiconductor channel material nanosheets is composed of a semiconductor material that is compositionally the same as a semiconductor material that provides each second semiconductor channel material nanosheet of the plurality of vertically stacked and spaced apart second semiconductor channel material nanosheets.

5. The semiconductor structure of claim 1, wherein each first semiconductor channel material nanosheet of the plurality of vertically stacked and spaced apart first semiconductor channel material nanosheets is composed of a semiconductor material that is compositionally different from a semiconductor material that provides each second semiconductor channel material nanosheet of the plurality of vertically stacked and spaced apart second semiconductor channel material nanosheets.

6. The semiconductor structure of claim 1, further comprising a gate cut dielectric pillar located adjacent to the first FET and the second FET, wherein the gate cut dielectric pillar lands on a surface of a shallow trench isolation structure.

7. The semiconductor structure of claim 1, wherein the first FET comprises first source/drain regions, and the second FET comprises second source/drain regions.

8. The semiconductor structure of claim 7, wherein the first source/drain regions are spaced apart from the second source/drain regions by an interlayer dielectric (ILD) layer.

9. The semiconductor structure of claim 8, wherein at least the first source/drain regions and the ILD layer are confined in an area between a pair of gate dielectric spacers.

10. The semiconductor structure of claim 7, wherein the second source/drain regions are diamond shaped.

11. The semiconductor structure of claim 7, wherein the second source/drain regions are non-diamond shaped.

12. The semiconductor structure of claim 7, further comprising a first source/drain contact structure contacting one of the first source/drain regions, and a second source/drain contact structure contacting one of the second source/drain regions.

13. The semiconductor structure of claim 1, wherein the horizontal inner spacer and the fork shaped inner spacer are composed of a compositionally same inner dielectric spacer material.

14. The semiconductor structure of claim 1, wherein the first FET is of a first conductivity type and the second FET is a second conductivity type, wherein the first conductivity type is different from the second conductivity type.

15. The semiconductor structure of claim 1, wherein the first FET is of a first conductivity type and the second FET is a second conductivity type, wherein the first conductivity type is the same as the second conductivity type.

* * * * *